(12) United States Patent
Yuan et al.

(10) Patent No.: US 11,842,684 B2
(45) Date of Patent: Dec. 12, 2023

(54) DISPLAY PANEL AND METHOD FOR DRIVING THE SAME, AND DISPLAY APPARATUS

(71) Applicant: BOE TECHNOLOGY GROUP CO., LTD., Beijing (CN)

(72) Inventors: Lijun Yuan, Beijing (CN); Ning Cong, Beijing (CN); Can Wang, Beijing (CN); Jinfei Niu, Beijing (CN); Minghua Xuan, Beijing (CN); Can Zhang, Beijing (CN)

(73) Assignee: Boe Technology Group Co., LTD., Beijing (CN)

( * ) Notice: Subject to any disclaimer, the term of this patent is extended or adjusted under 35 U.S.C. 154(b) by 9 days.

(21) Appl. No.: 17/761,161

(22) PCT Filed: Dec. 9, 2020

(86) PCT No.: PCT/CN2020/134972
§ 371 (c)(1),
(2) Date: Mar. 16, 2022

(87) PCT Pub. No.: WO2022/120647
PCT Pub. Date: Jun. 16, 2022

(65) Prior Publication Data
US 2023/0162675 A1    May 25, 2023

(51) Int. Cl.
*G09G 3/3233* (2016.01)
*G09G 3/20* (2006.01)
(Continued)

(52) U.S. Cl.
CPC ......... *G09G 3/3233* (2013.01); *G09G 3/2088* (2013.01); *G09G 3/32* (2013.01);
(Continued)

(58) Field of Classification Search
None
See application file for complete search history.

(56) References Cited

U.S. PATENT DOCUMENTS 9,542,901 B2 * 1/2017 Kim ............... G09G 3/3677
10,403,207 B2 * 9/2019 Kang ............. G09G 3/3258
(Continued)

FOREIGN PATENT DOCUMENTS

CN    106531072 A * 3/2017
CN    110632767 A * 12/2019 ........... H04N 13/307

OTHER PUBLICATIONS

CN-106531072-A (English translation) (Year: 2017).*
CN-110632767-A (English translation) (Year: 2019).*

*Primary Examiner* — Dorothy Harris
(74) *Attorney, Agent, or Firm* — IP & T GROUP LLP

(57) ABSTRACT

A display panel includes a substrate, a plurality of display units, a driving circuit and a gating circuit. Each display unit includes a plurality of pixel islands, and each pixel island includes a plurality of sub-pixels of a same color. The driving sub-circuit is configured to output driving signals. The gating circuit is coupled to the driving circuit, and is further coupled to sub-pixels of pixel islands in at least part of the plurality of display units. The gating circuit is configured to control a connection of the driving circuit to sub-pixels of pixel islands of at least one display unit in the at least part of the plurality of display units, so that the sub-pixels of the pixel islands of the at least one display unit are driven by at least one driving signal from the driving circuit to perform display.

18 Claims, 19 Drawing Sheets

(51) Int. Cl.
*G09G 3/32* (2016.01)
*G11C 19/28* (2006.01)
*G06F 3/01* (2006.01)

(52) U.S. Cl.
CPC .............. *G11C 19/28* (2013.01); *G06F 3/013* (2013.01); *G09G 2310/0267* (2013.01); *G09G 2310/0286* (2013.01); *G09G 2330/021* (2013.01); *G09G 2354/00* (2013.01); *G09G 2370/18* (2013.01); *G09G 2380/00* (2013.01)

(56) References Cited

U.S. PATENT DOCUMENTS

| | | | |
|---|---|---|---|
| 2013/0321499 A1* | 12/2013 | Park | G09G 3/3275 |
| | | | 345/698 |
| 2015/0201139 A1* | 7/2015 | Funatsu | H04N 25/59 |
| | | | 348/273 |
| 2015/0310821 A1* | 10/2015 | Kim | G09G 3/3677 |
| | | | 345/212 |
| 2016/0248956 A1* | 8/2016 | Mitsunaga | H04N 25/133 |
| 2017/0117341 A1* | 4/2017 | Chen | H10K 59/123 |
| 2017/0357091 A1* | 12/2017 | Jin | H10K 59/353 |
| 2019/0035333 A1* | 1/2019 | Chen | G09G 3/3241 |
| 2021/0057493 A1* | 2/2021 | Liu | H10K 59/353 |
| 2021/0134844 A1* | 5/2021 | Liu | H10K 50/858 |
| 2021/0384267 A1* | 12/2021 | Yu | C23C 14/042 |
| 2022/0311991 A1* | 9/2022 | Hong | H04N 13/32 |

* cited by examiner

P

L

DISPLAY PANEL AND METHOD FOR DRIVING THE SAME, AND DISPLAY APPARATUS

CROSS-REFERENCE TO RELATED APPLICATION

This application is a national phase entry under 35 USC 371 of International Patent Application No. PCT/CN2020/134972, filed on Dec. 9, 2020, which is incorporated herein by reference in its entirety.

TECHNICAL FIELD

The present disclosure relates to the field of display technologies, and in particular, to a display panel and a method for driving the same, and a display apparatus.

BACKGROUND

Self-luminous devices have been widely used in various terminal display products with high-resolution color screens due to their advantages such as high brightness, continuously adjustable emission color, low cost, fast response speed, low energy consumption, low driving voltage, wide operating temperature range, simple manufacturing process and high luminous efficiency.

SUMMARY

In an aspect, a display panel is provided. The display panel has an active area. The display panel includes a substrate, a plurality of display units, a driving circuit, and a gating circuit. The plurality of display units are disposed on the substrate, and are located in the active area. The driving circuit is disposed on the substrate, and is located outside the active area. The gating circuit is disposed on the substrate. Each display unit includes a plurality of pixel islands, and each pixel island includes a plurality of sub-pixels of a same color. The driving sub-circuit is configured to output a plurality of driving signals. The gating circuit is coupled to the driving circuit, and is further coupled to sub-pixels of pixel islands in at least part of the plurality of display units. The gating circuit is configured to control a connection of the driving circuit to sub-pixels of pixel islands of at least one display unit in the at least part of the plurality of display units, so that the sub-pixels of the pixel islands of the at least one display unit are driven by at least one driving signal from the driving circuit to perform display.

In some embodiments, the display panel further includes a plurality of control signal lines. The plurality of driving signal lines are disposed on the substrate. The driving circuit includes a plurality of driving signal output terminals for transmitting the plurality of driving signals. The gating circuit includes a plurality of gating sub-circuits. A gating sub-circuit in the plurality of gating sub-circuits is coupled to at least one control signal line, sub-pixels of pixel islands in a display unit and at least one driving signal output terminal. The gating sub-circuit is configured to transmit at least one driving signal received at the at least one driving signal output terminal to the sub-pixels of pixel islands in the display unit in response to control signal(s) transmitted by the at least one control signal line.

In some embodiments, the display unit includes at least one row of sub-pixels. The gating sub-circuit includes at least one switching sub-circuit. A switching sub-circuit is coupled to a control signal line, a driving signal output terminal and a row of sub-pixels in the display unit. The switching sub-circuit is configured to transmit a driving signal received at the driving signal output terminal to the row of sub-pixels coupled to the switching sub-circuit in response to a control signal transmitted by the control signal line.

In some embodiments, the plurality of display units are arranged in an array. Switching sub-circuits coupled to sub-pixels in a same row in display units in a row of display units, are coupled to a same driving signal output terminal.

In some embodiments, at least one switching sub-circuit in the gating sub-circuit is coupled to a same control signal line.

In some embodiments, the switching sub-circuit includes a gating transistor. A control electrode of the gating transistor is coupled to the control signal line, a first electrode of the gating transistor is coupled to the driving signal output terminal, and a second electrode of the gating transistor is coupled to the row of sub-pixels in the display unit.

In some embodiments, different gating sub-circuits are coupled to different control signal lines.

In some embodiments, the display panel further includes a plurality of input signal lines. The plurality of input signal lines are disposed on the substrate. The driving circuit includes a plurality of driving sub-circuits. Each driving sub-circuit is coupled to an input signal line, and the driving sub-circuit includes driving signal output terminals. The driving sub-circuit is configured to output driving signals through the driving signal output terminals of the driving sub-circuit according to an input signal transmitted by the input signal line.

In some embodiments, the driving sub-circuit includes a plurality of shift registers that are cascaded. An output terminal of a shift register in each stage is a driving signal output terminal. An input terminal of a first-stage shift register is coupled to the input signal line. The output terminal of the shift register in each stage except a last-stage shift register is coupled to an input terminal a shift register in a next stage.

In some embodiments, the display panel further includes a plurality of data lines. The plurality of data lines are disposed on the substrate. A sub-pixel in the sub-pixels of the pixel islands of the at least one display unit includes a pixel circuit. The pixel circuit includes a data writing sub-circuit, and the data writing sub-circuit is coupled to the gating circuit and a data line. The data writing sub-circuit is configured to write a data signal transmitted by the data line in response to a driving signal from the gating circuit.

In some embodiments, each sub-pixel in the sub-pixels of the pixel islands of the at least one display unit includes a light-emitting device. The light-emitting device includes a light-emitting layer, and no gap exists between light-emitting layers of light-emitting devices in sub-pixels in a pixel island of the at least one display unit.

In some embodiments, the display panel further includes an optical film. The optical film is disposed on a side of the plurality of display units away from the substrate. The optical film is configured to refract light emitted by the sub-pixels of the pixel islands of the at least one display unit in the display panel, so as to disperse the light to a plurality of pixel regions.

In another aspect, a display apparatus is provided. The display apparatus includes the display panel as described in any one of the above embodiments.

In some embodiments, the display apparatus further includes a processing device. The processing device is configured to: transmit at least one control signal to the gating circuit in the display panel according to information of a region that is to display an image of the display panel, so as to realize a connection of the driving circuit in the display panel to at least one display unit corresponding to the region that is to display the image in the display panel; and transmit at least one input signal to the driving circuit in the display panel according to the information of the region that is to display the image of the display panel, so that the driving circuit transmits at least one driving signal to the at least one display unit corresponding to the region that is to display the image.

In some embodiments, the display apparatus further includes an information acquisition device coupled to the processing device. The information acquisition device is configured to acquire information of a sight line of a user. The processing device is further configured to obtain the information of the sight line of the user, and determine the information of the region that is to display the image of the display panel according to the information of the sight line of the user.

In yet another aspect, a method for driving the display panel according to any one of the above embodiments is provided. The driving method includes: transmitting at least one input signal to the driving circuit in the display panel according to information of a region that is to display an image of the display panel, so that the driving circuit transmits at least one driving signal to at least one display unit corresponding to the region that is to display the image in response to the at least one input signal; and transmitting at least one control signal to the gating circuit in the display panel according to the information of the region that is to display the image of the display panel, so that the gating circuit realizes a connection of the driving circuit to the at least one display unit corresponding to the region that is to display the image in the plurality of display units according to the at least one control signal, and the at least one display unit receives the at least one driving signal from the driving circuit, so that the at least one display unit corresponding to the region that is to display the image is driven to perform display.

In some embodiments, the driving method further includes: obtaining information of a sight line of a user; and determining the information of the region that is to display the image of the display panel according to the information of the sight line of the user.

In some embodiments, the gating circuit is located in the active area and outside the plurality of display units.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
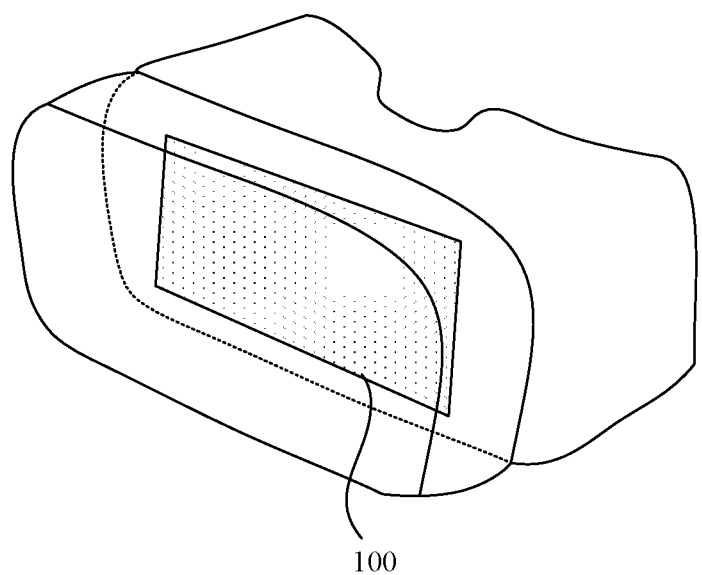
FIG. 1 is a structural diagram of a display apparatus, in accordance with some embodiments.

Technical solutions in some embodiments of the present disclosure will be described clearly and completely below with reference to accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, features defined with "first" and "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms such as "coupled" and "connected" and derivatives thereof may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

As used herein, the term "if", depending on the context, is optionally construed as "when", "in a case where", "in response to determining", or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" used herein has an open and inclusive meaning, which does not exclude devices that are applicable to or configured to perform additional tasks or steps.

The terms such as "about", "substantially" or "approximately" as used herein include a stated value and an average value within an acceptable range of deviation of a particular value. The acceptable range of deviation is determined by a person of ordinary skill in the art in view of the measurement in question and errors associated with the measurement of a particular quantity (i.e., limitations of the measurement system).

Exemplary embodiments are described herein with reference to cross-sectional views and/or plan views as idealized exemplary drawings. In the accompanying drawings, thickness of layers and regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. For example, the display apparatus may be any apparatus that displays an image whether in motion (e.g., a video) or stationary (e.g., a static image), and whether literal or graphical. The embodiments of the present disclosure do not particularly limit a specific form of the display apparatus. For example, the display apparatus may be a micro display apparatus. For example, the micro display apparatus may include a head-mounted display apparatus. For example, the head-mounted display apparatus may include a virtual reality (VR) display apparatus or an augmented reality (AR) display apparatus.

Figure 2:
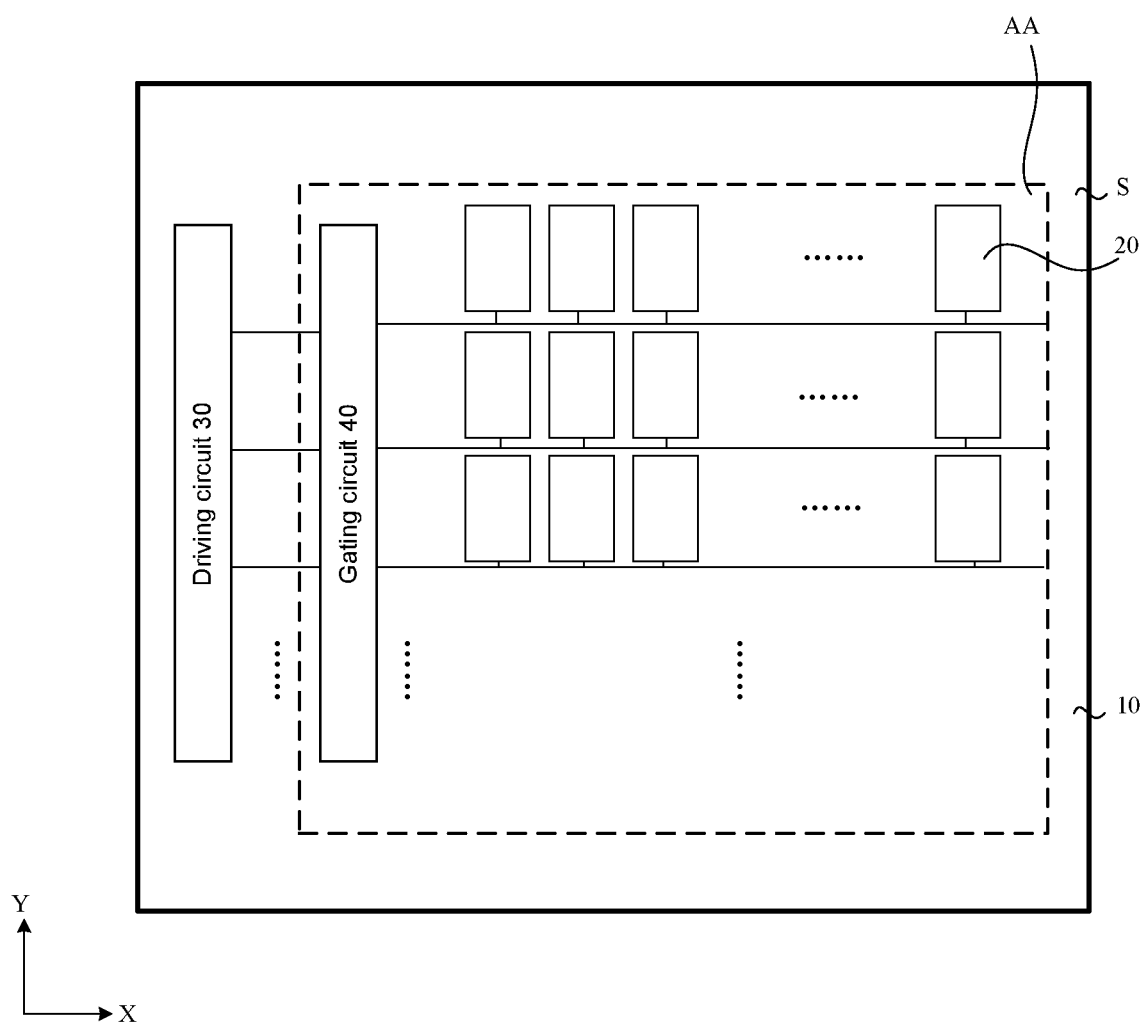
FIG. 2 is a structural diagram of a display panel, in accordance with some embodiments.

In some embodiments, as shown in FIG. 1, the display apparatus 200 includes a display panel 100. As shown in FIG. 2, the display panel 100 has an active area (AA) and a peripheral area S. The peripheral area S is located on at least one side of the AA.

Figure 3:
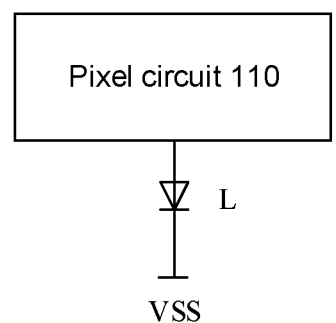
FIG. 3 is a structural diagram of a sub-pixel, in accordance with some embodiments.

In some embodiments, the display panel includes a plurality of sub-pixels located in the AA. As shown in FIG. 3, at least one sub-pixel P (e.g., each sub-pixel P) includes a pixel circuit 110 and a light-emitting device L. The pixel circuit 110 is coupled to the light-emitting device L. The pixel circuit 110 is configured to drive the light-emitting device L to emit light. For example, pixel circuits are arranged in an array.

It will be noted that, the embodiments of the present disclosure do not limit a specific structure of the pixel circuit, which may be designed according to actual situations. For example, the pixel circuit is composed of electronic devices such as transistors (e.g., thin film transistors (TFTs)) and capacitor(s) (abbreviated as C). For example, the pixel circuit may include two transistors and one capacitor to constitute a 2T1C structure. Of course, the pixel circuit may also include more than two transistors and at least one capacitor, such as seven transistors and one capacitor, which constitute a 7T1C structure.

Figure 4:
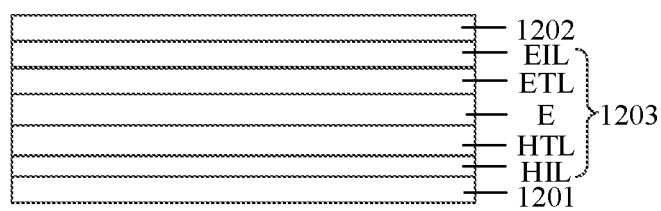
FIG. 4 is a structural diagram of a light-emitting device, in accordance with some embodiments.

For example, the light-emitting device may be a current-driven light-emitting device including a light-emitting diode (LED), an organic light-emitting diode (OLED) or a quantum dot light-emitting diode (QLED). For example, as shown in FIG. 4, the light-emitting device L includes a cathode 1202, an anode 1201, and a light-emitting functional layer 1203 located between the cathode 1202 and the anode 1201. The light-emitting functional layer 1203 may include, for example, a light-emitting layer E, a hole transport layer (HTL) between the light-emitting layer E and the anode 1201, and an electron transport layer (ETL) between the light-emitting layer E and the cathode 1202. Of course, according to needs, in some embodiments, a hole injection layer (HIL) may further be provided between the hole transport layer HTL and the anode, and an electron injection layer (EIL) may further be provided between the electron transport layer ETL and the cathode 1202.

The anode may be made of, for example, a transparent conductive material with a high work function, and an electrode material of the anode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), or carbon nanotubes. The cathode may be made of, for example, a material with a high conductivity and a low work function, and an electrode material of the cathode may include an alloy such as a magnesium aluminum (MgAl) alloy or a lithium aluminum (LiAl) alloy, or a simple metal such as magnesium (Mg), aluminum (Al), lithium (Li), or silver (Ag). A material of the light-emitting layer may be selected according to a color of light emitted by the light-emitting layer. For example, the material of the light-emitting layer includes a fluorescent light-emitting material or a phosphorescent light-emitting material. For example, in at least one embodiment of the present disclosure, the light-emitting layer may adopt a doping system. That is, a dopant material is mixed into a host light-emitting material to obtain a usable light-emitting material. For example, the host light-emitting material may be a metal compound material, a derivative of anthracene, an aromatic diamine compound, a triphenylamine compound, an aromatic triamine compound, a derivative of biphenyldiamine, or a triarylamine polymer.

In some embodiments of the present disclosure, a display panel is provided. As shown in FIG. 2, the display panel 100 includes a substrate 10, a plurality of display units 20, a driving circuit 30 and a gating circuit 40. The plurality of display units 20, the driving circuit 30 and the gating circuit 40 are all disposed on the substrate 10.

For example, the substrate 10 may include a rigid substrate (or referred to as a hard substrate) such as glass, or a flexible substrate such as polyimide (PI). The substrate 10 may further include a film such as a buffer layer disposed on the rigid substrate or the flexible substrate. For example, the substrate 10 may be a silicon-based substrate.

Figure 5:
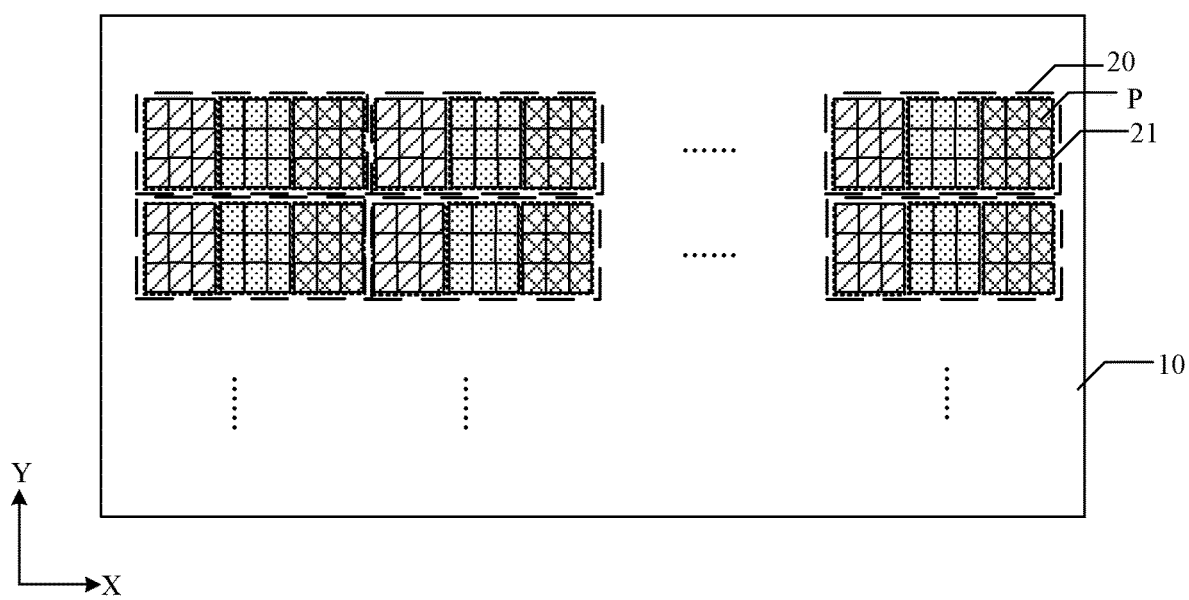
FIG. 5 is a structural diagram of another display panel, in accordance with some embodiments.

As shown in FIG. 5, each display unit 20 includes a plurality of pixel islands 21. Each pixel island 21 includes sub-pixels P of a same color. For example, colors of the plurality of pixel islands 21 in the display unit 20 are different from each other. It will be understood that the plurality of display units 20 are located in the AA.

For example, a plurality of pixel islands may be arranged in an array. For example, pixel islands 21 arranged in a line in an X direction (a horizontal direction) in FIG. 5 are referred to as pixel islands in a same row, and pixel islands 21 arranged in a line in a Y direction (a vertical direction) in FIG. 5 are referred to as pixel islands in a same column. For example, the plurality of sub-pixels may be arranged in an array. For example, sub-pixels P arranged in a line in the X direction in FIG. 5 are referred to as sub-pixels in a same row, and sub-pixels P arranged in a line in the Y direction in FIG. 5 are referred to as sub-pixels in a same column.

It will be noted that, the number of sub-pixels in the pixel island may be designed according to actual situations, for example, according to a size of a region where a sight line of a user is mapped on the display panel. For example, the sub-pixels in the pixel island are arranged in an array of 3 rows and 3 columns (as shown in FIG. 5). Alternatively, the sub-pixels in the pixel island are arranged in an array of 5 rows and 5 columns, which is not specifically limited herein.

For example, the plurality of sub-pixels include sub-pixels for emitting light of a first color, sub-pixels for emitting light of a second color, and sub-pixels for emitting light of a third color. Correspondingly, the plurality of pixel islands include pixel islands for emitting light of a first color, pixel islands for emitting light of a second color, and pixel islands for emitting light of a third color. For example, the first color, the second color and the third color are three primary colors. For example, the first color, the second color and the third color are red, green and blue, respectively. That is, the plurality of sub-pixels include red sub-pixels, green sub-pixels and blue sub-pixels, and the plurality of pixel islands include red pixel islands, green pixel islands and blue pixel islands. For example, a display unit includes a red pixel island, a green pixel island, and a blue pixel island.

In some embodiments, the sub-pixel includes the light-emitting device, and the light-emitting device includes the light-emitting layer. No gap exists between light-emitting layers of light-emitting devices in sub-pixels in a pixel island. For example, the light-emitting layers of the light-emitting devices in the sub-pixels in the pixel island are connected to constitute an integral structure.

For example, in a process of forming the light-emitting layers, each opening of a mask (e.g., a fine metal mask (FMM)) may correspond to light-emitting layers of all light-emitting devices in a pixel island. That is, the light-emitting layers in the pixel island are formed by means of evaporation together through a same opening of the mask. That is to say, the light-emitting layers of the light-emitting devices in the pixel island may be formed by means of evaporation together through the same opening of the mask.

As for a display panel with high pixels per inch (PPI), a distance between adjacent sub-pixels is small, and in a process of forming light-emitting layers by means of evaporation through a mask, a light-emitting layer of a light-emitting device in each sub-pixel is formed by means of evaporation through an opening of the mask, which leads to high requirements for the mask and great difficulty in forming the light-emitting layer due to limitation of the mask. For this, in the embodiments of the present disclosure, the light-emitting layers of the light-emitting devices in the sub-pixels may be formed by means of evaporation through the same opening of the mask, the requirements for the mask are relatively low, and light-emitting layers in a display panel with high PPI (e.g., 1000 PPI to 10000 PPI) may be formed by a mask for manufacturing light-emitting layers in a display panel with low PPI (e.g., 400 PPD. In this way, a display panel with a large number of pixels per inch may be manufactured by using a mask with a small number of openings per inch. As a result, not only the display panel with the high PPI may be achieved, but also a manufacturing difficulty of the mask and a difficulty of the evaporation process may be reduced.

For example, the pixel islands have a same size and the same number of sub-pixels, and include sub-pixels with a same size. For example, the size of the pixel island is related to the sizes of the sub-pixels included in the pixel island. For example, the size of the pixel island is approximately equal to a total size of n sub-pixels, and n is the number of the sub-pixels in the pixel island.

As shown in FIG. 2, the driving circuit 30 is located outside the AA. That is, the driving circuit 30 is located in the peripheral area S. The gating circuit 40 is located in the AA, and the gating circuit 40 is located on an outer side of the plurality of display units 20. The gating circuit 40 is coupled to the driving circuit 30, and the gating circuit 40 is further coupled to at least one display unit 20. The driving circuit 30 is configured to output a plurality of driving signals. For example, the driving signal may be a gate driving signal.

The gating circuit 40 is configured to control a connection of the driving circuit 30 to at least one display unit 20, so that sub-pixels P in pixel islands 21 in the at least one display unit 20 are driven to perform display according to at least one driving signal from the driving circuit 30.

It will be understood that, the gating circuit 40 controls at least one display unit 20 of the plurality of display units 20 to be connected to the driving circuit 30, and the driving circuit 30 transmits at least one driving signal to the at least one display unit 20 connected thereto, so that sub-pixels P in pixel islands 21 in the display unit(s) 20 receive the driving signal(s). Then, pixel circuits 110 in the sub-pixels P generate driving currents according to the received driving signal(s), thereby driving light-emitting devices L to emit light, and causing the at least one display unit 20 of the plurality of display units 20 to perform display. In this case, part (one or more display units) of the plurality of display units in the display panel perform display, and remaining display units do not perform display. That is, an image is displayed on a partial region of the display panel, and is not displayed on a remaining region. In this way, by means of the gating circuit, it is possible to separately control each display unit to be connected to the driving circuit, so as to separately control each display unit in the display panel to be in a display state or a non-display state, thereby achieving separate driving of the plurality of display units, and achieving separate control of display of the plurality of display units. Therefore, compared with a case where all the sub-pixels in the display panel are connected to the driving circuit, i.e., all the sub-pixels are driven, so that the display panel can perform full-screen display only, the display panel provided by the embodiments of the present disclosure may achieve partitioned display, thereby reducing display power consumption.

For example, the display panel (or a display screen) may be divided into a plurality of display sub-screens according to the plurality of display units. A display unit corresponds to a display sub-screen, and an active area of the display unit corresponds to an active area of the display sub-screen. In this way, in a case where part of the plurality of display units perform display, part of display sub-screens in the display panel display an image together, and remaining display sub-screen(s) do not display the image, so that split-screen display is achieved; in a case where all the plurality of display units perform display, all the display sub-screens in the display panel display an image together, so that the full-screen display is achieved.

Therefore, in the display panel provided by the embodiments of the present disclosure, the gating circuit in the display panel controls the at least one display unit to be connected to the driving circuit, so that the sub-pixels in the pixel islands in the at least one display unit are driven to perform display according to the at least one driving signal from the driving circuit. In this case, by means of the gating circuit, it may be possible to separately control each display unit to be connected to the driving circuit, so as to separately control each display unit in the display panel to be in the display state or the non-display state, thereby achieving separate driving of the plurality of display units, and achieving separate control of the display of the plurality of display units. Therefore, compared with a display panel that can perform the full-screen display only, the display panel provided by the embodiments of the present disclosure may achieve the partitioned display, thereby reducing the display power consumption.

Figure 6:
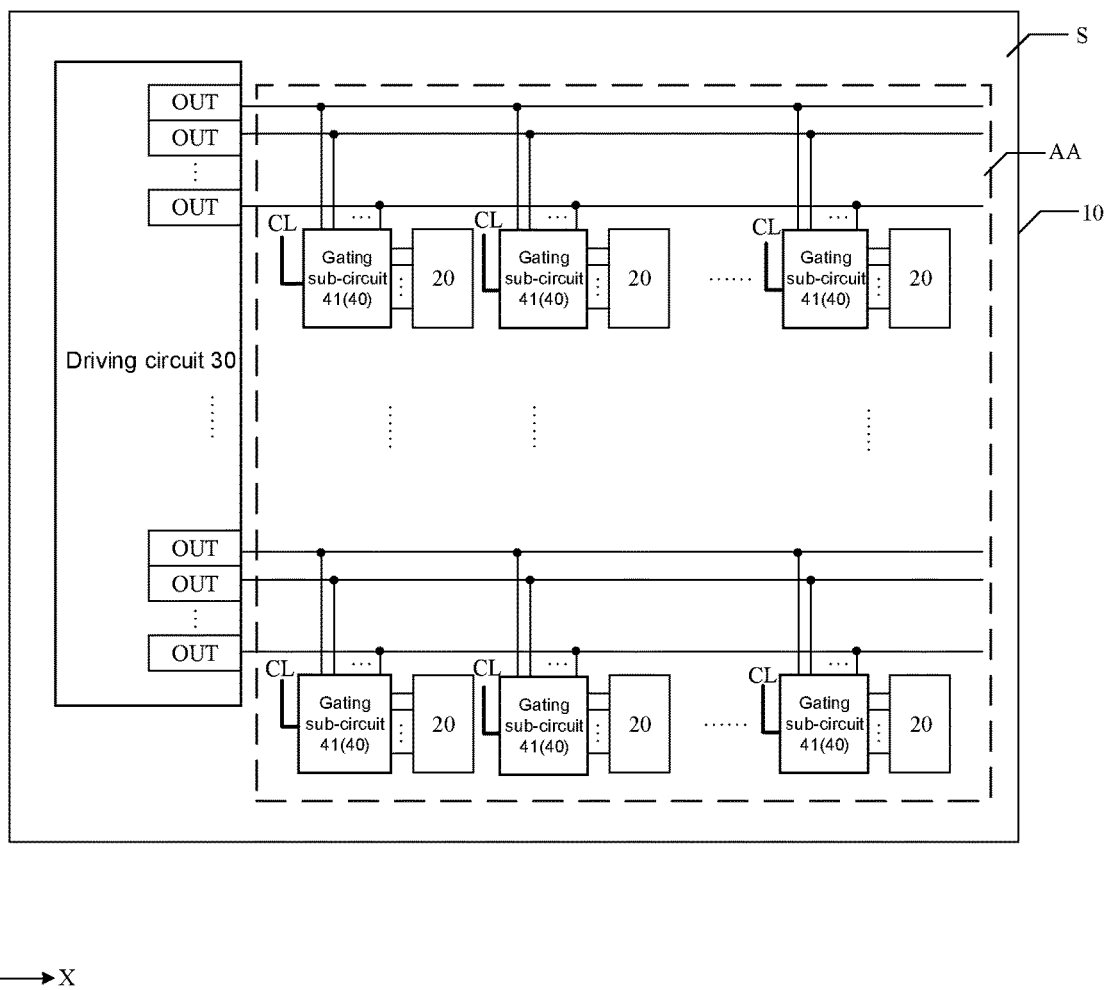
FIG. 6 is a structural diagram of yet another display panel, in accordance with some embodiments.

In some embodiments, as shown in FIG. 6, the display panel 100 further includes a plurality of control signal lines CL. The plurality of control signal lines CL are disposed on the substrate 10. It will be understood that, the control signal lines are configured to transmit control signals. For example, a control signal line may transmit a control signal. As shown in FIG. 6, the driving circuit 30 includes a plurality of driving signal output terminals OUT. The driving signal output terminals OUT are configured to output the plurality of driving signals. The gating circuit 40 includes a plurality of gating sub-circuits 41. A gating sub-circuit 41 is coupled to at least one control signal line CL, a display unit 20, and at least one driving signal output terminal OUT. For example, the number of the gating sub-circuits is the same as the number of the display units.

It will be noted that, a position of the gating sub-circuit may be designed according to actual situations, which is not limited herein. For example, the gating sub-circuit may be located in the peripheral area. For example, the gating sub-circuit may be located in a region outside the display unit coupled thereto. For example, the gating sub-circuit is located in a region between two adjacent display units.

The gating sub-circuit is configured to transmit at least one driving signal received at the at least one driving signal output terminal to sub-pixels in pixel islands in the display unit in response to control signal(s) transmitted by the at least one control signal line. It will be understood that, under control of the control signal(s), the gating sub-circuit is turned on, and the display unit coupled to the gating sub-circuit is connected to the driving circuit, so that driving signal(s) output by the driving circuit may be transmitted to the display unit, and the sub-pixels in the pixel islands in the display unit perform display under control of the driving signal(s). That is, pixel circuits in the sub-pixels provide driving currents to light-emitting devices under the control of the driving signal(s) to drive the light-emitting devices to emit light. In this case, by controlling the gating sub-circuit to be turned on or off, it is possible to control the display unit to be connected or not connected to the driving circuit, and control display unit conducted to the driving circuit to perform display, and control display unit not connected to the driving circuit not to perform display. As a result, the display panel may achieve the partitioned display, and the power consumption of the display panel may be reduced.

In some embodiments, the display unit includes at least one row of sub-pixels. For example, referring to FIG. 5, the display unit 20 includes three pixel islands sequentially arranged in a row direction (e.g., the X direction in FIG. 5), and the three pixel islands include red sub-pixels, green sub-pixels, and blue sub-pixels, respectively. A row of sub-pixels in the display unit includes a row of red sub-pixels in a pixel island, a row of green sub-pixels in another pixel island, and a row of blue sub-pixels in yet another pixel island. That is, the row of red sub-pixels, the row of green sub-pixels, and the row of blue sub-pixels are included in the same row of sub-pixels.

Figure 7:
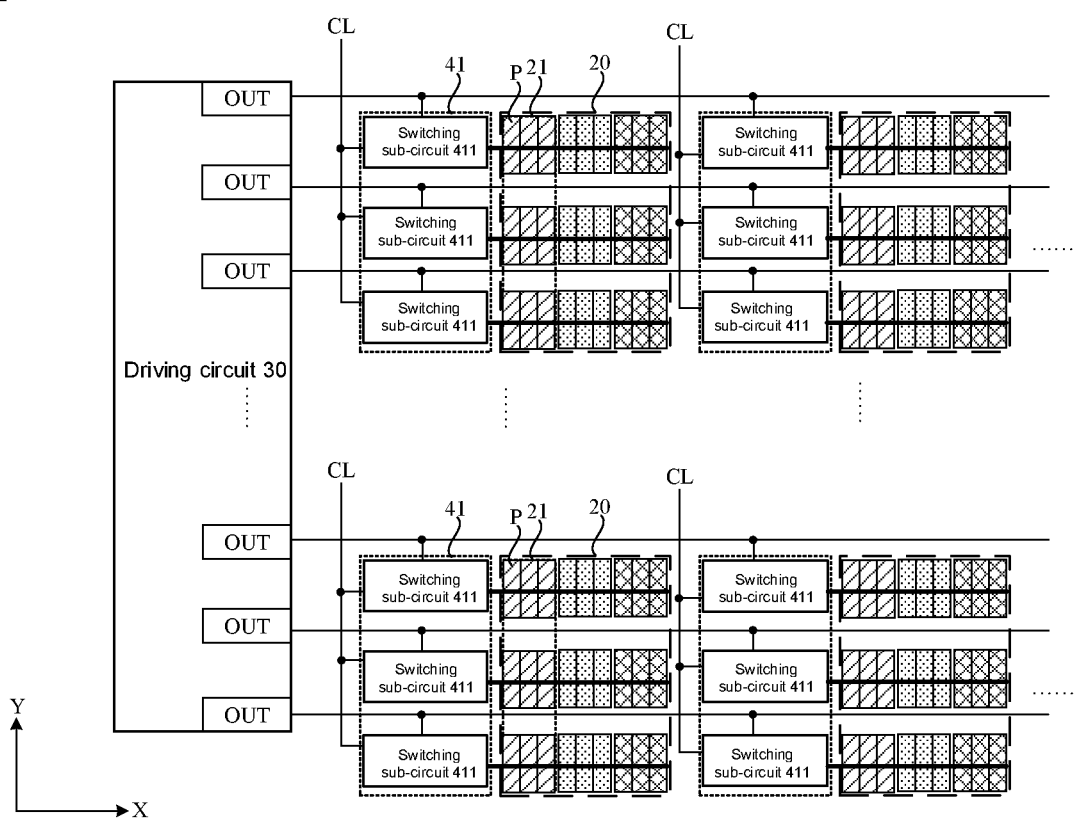
FIG. 7 is a structural diagram of yet another display panel, in accordance with some embodiments.

As shown in FIG. 7, the gating sub-circuit 41 includes at least one switching sub-circuit 411. A switching sub-circuit 411 is coupled to a control signal line CL, a driving signal output terminal OUT, and a row of sub-pixels in the display unit 20. For example, the number of the switching sub-circuits is the same as the number of rows of sub-pixels included in the display unit. For example, in a case where the display unit 20 includes two rows of sub-pixels P, the gating sub-circuit 41 coupled to the display unit 20 includes two switching sub-circuits 411. For example, in a case where the display unit includes three rows of sub-pixels, referring to FIG. 7, the gating sub-circuit coupled to the display unit includes three switching sub-circuits.

The switching sub-circuit is configured to transmit a driving signal received at the driving signal output terminal to the row of sub-pixels coupled to the switching sub-circuit in response to a control signal transmitted by the control signal line. It will be understood that, under control of the control signal, the switching sub-circuit is turned on, and the row of sub-pixels is connected to the driving signal output terminal of the driving circuit, so that the row of sub-pixels receives the driving signal from the driving signal output terminal, and pixel circuits in the row of sub-pixels drive light-emitting devices to emit light under control of the driving signal, thereby achieving display of the row of sub-pixels. In a case where a switching sub-circuit coupled to each row of sub-pixels in the display unit is turned on, each row of sub-pixels in the display unit may receive a driving signal, so that all the sub-pixels in the pixel islands in the display unit perform display. For example, the plurality of rows of sub-pixels in the display unit may be driven row by row, and may display an image row by row.

Figure 8:
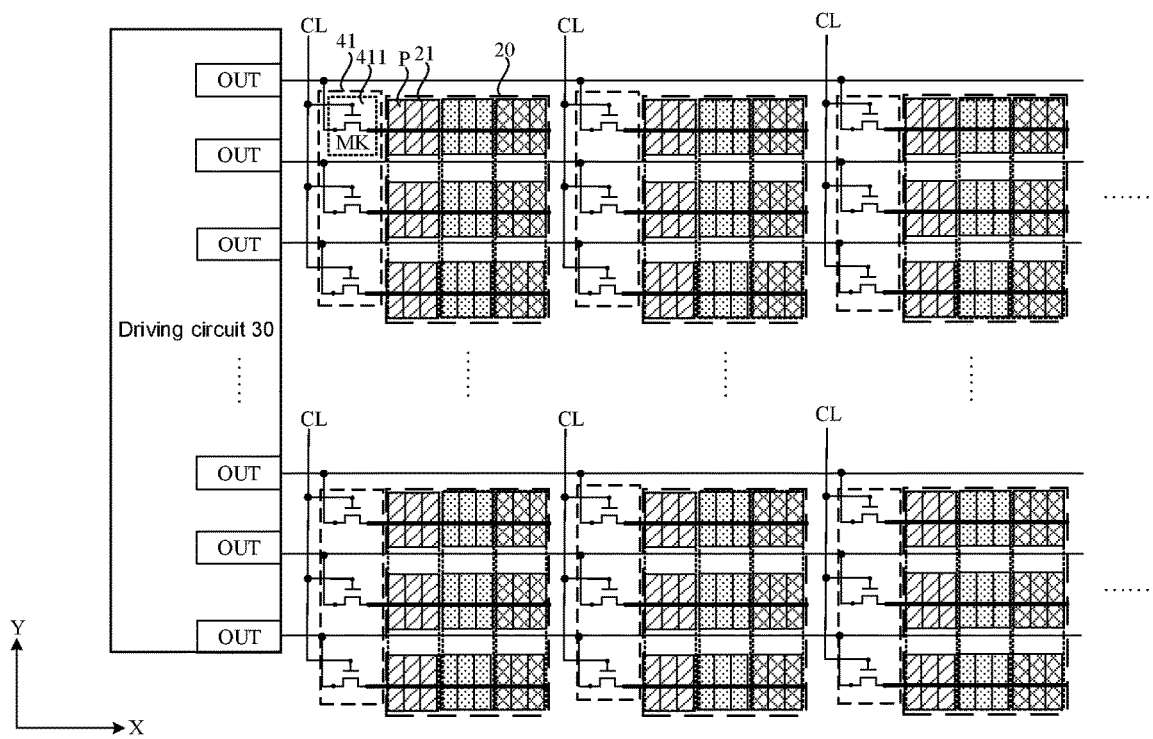
FIG. 8 is a structural diagram of yet another display panel, in accordance with some embodiments.

For example, as shown in FIG. 8, the switching sub-circuit 411 includes a gating transistor MK. A control electrode of the gating transistor MK is coupled to the control signal line CL, a first electrode of the gating transistor MK is coupled to the driving signal output terminal OUT, and a second electrode of the gating transistor MK is coupled to the row of sub-pixels P in the display unit 20. It will be understood that, in response to the control signal transmitted by the control signal line CL, the gating transistor MK is turned on to transmit the driving signal received at the driving signal output terminal OUT to the row of sub-pixels P to drive the row of sub-pixels P to perform display.

For example, the plurality of display units are arranged in an array. Switching sub-circuits coupled to sub-pixels in a same row in display units in a row of display units are coupled to a same driving signal output terminal.

It will be noted that, in the row of display units, sub-pixels in rows with a same serial number in pixel islands are the sub-pixels in the same row. For example, in the row of display units, sub-pixels in i-th rows in the pixel islands in the display units are the sub-pixels in the same row, and are sub-pixels in an i-th row in the display units, and i is a positive integer.

It will be understood that, the driving circuit outputs driving signals to the display units row by row, and by controlling the switching sub-circuits to be turned on or off separately, display units connected to the driving circuit in each row of display units may perform display; and display unit(s) in at least one column in each row of display units may be controlled to perform display, thereby achieving partitioned driving of the display units.

For example, at least one switching sub-circuit in the gating sub-circuit is coupled to a same control signal line. In this case, a wiring design of the display panel may be simplified. For example, the at least one switching sub-circuit in the gating sub-circuit receives a same control signal, and may be turned on or off simultaneously.

In some embodiments, different gating sub-circuits are coupled to different control signal lines. In this case, different gating sub-circuits receive different control signals, so that the display units are connected to the driving circuit at different times, and the display panel is controlled to achieve the partitioned display.

Figure 9:
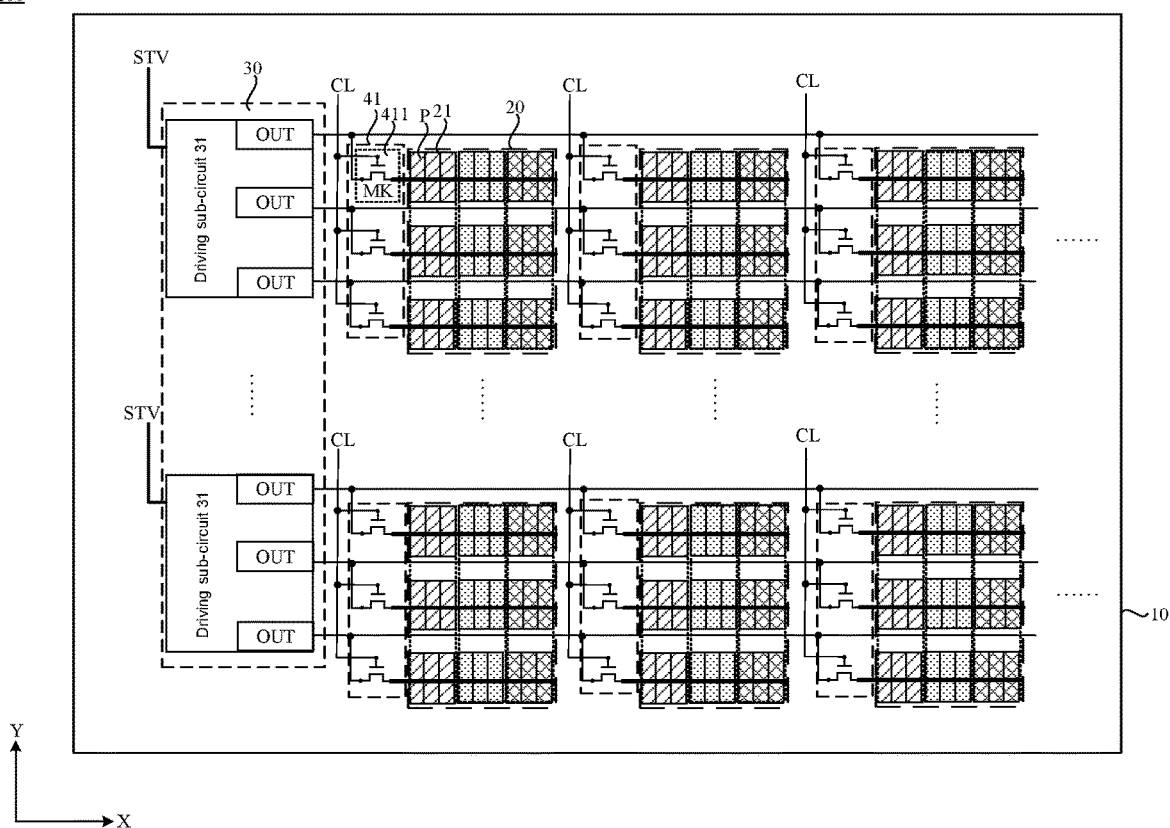
FIG. 9 is a structural diagram of yet another display panel, in accordance with some embodiments.

In some embodiments, as shown in FIG. 9, the display panel 100 further includes a plurality of input signal lines STV. The plurality of input signal lines STV are disposed on the substrate 10. The input signal lines STV are each configured to transmit an input signal.

As shown in FIG. 9, the driving circuit 30 includes a plurality of driving sub-circuits 31. Each driving sub-circuit 31 is coupled to an input signal line STV. The driving sub-circuit 31 includes multiple driving signal output terminals OUT. The driving sub-circuit 31 is configured to output multiple driving signals through the multiple driving signal output terminals OUT of the driving sub-circuit 31 according to an input signal transmitted by the input signal line STV. It will be understood that, according to a different input signal, a different driving sub-circuit may be controlled to output a driving signal to control a different display unit to perform display.

For example, each driving sub-circuit may provide a driving signal to a row of display units. In a case where the row of display units does not perform display, i.e., the gating sub-circuit coupled to each display unit in the row of display units is in a turn-off state, i.e., each display unit in the row of display units is not connected to the driving sub-circuit, the driving sub-circuit that provides the driving signal to the row of display units may not work, and there is no input signal transmitted on an input signal line coupled to the non-working driving sub-circuit. In this case, there are input signals transmitted on input signal lines coupled to driving sub-circuits that provide driving signals to display units to perform display, these driving sub-circuits work, and other driving sub-circuit(s) may not work, so that the power consumption of the display panel may be reduced.

For example, in a case where the display panel is in a full-screen display state, the sub-pixels in the display panel may be sequentially driven row by row; and in a case where the display panel is in a partial display state, sub-pixels in display units that are to perform display in the display panel may be sequentially driven row by row.

For example, in a row direction in which the sub-pixels are arranged, one driving circuit 30 may be provided on one of two opposite outer sides of the AA, and the display panel 100 may output driving signals from a single side through the driving circuit 30. In this way, it is possible to reduce an area of the peripheral area S, and to simplify a circuit design of the display panel 100. For example, in the row direction in which the sub-pixels are arranged, two driving circuits 30 may be provided on the two opposite outer sides of the AA, respectively. In this case, the display panel 100 may adopt double-sided simultaneous driving, and the two driving circuits 30 output driving signals simultaneously from both sides, so that a voltage drop generated during transmission of the driving signals may be reduced, and in turn, display uniformity may be improved; alternatively, the display panel 100 may adopt double-sided alternate driving, and outputs driving signals alternately from both sides through the two driving circuits 30.

Figure 10A:
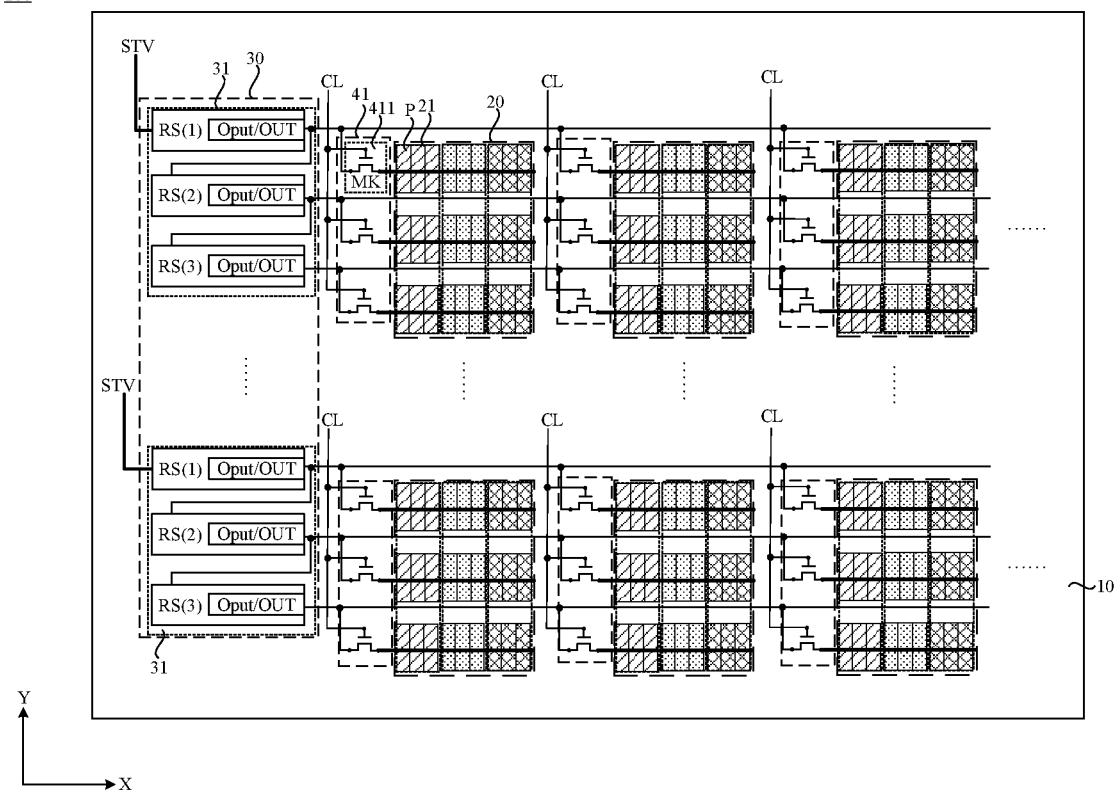
FIG. 10A is a structural diagram of yet another display panel, in accordance with some embodiments.
Figure 10B:
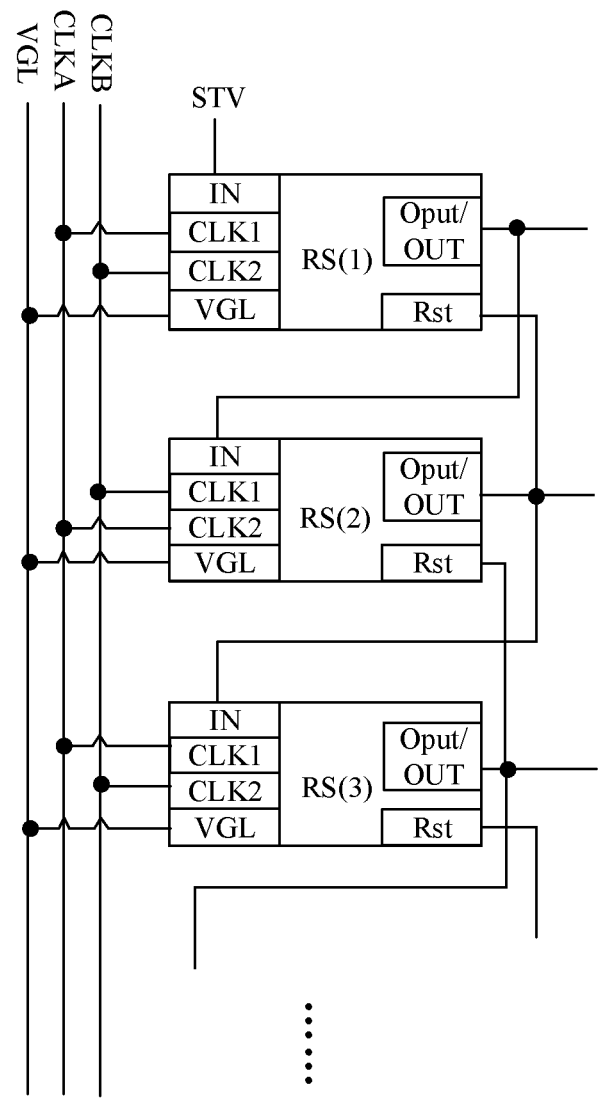
FIG. 10B is a structural diagram of a driving sub-circuit, in accordance with some embodiments.

In some embodiments, as shown in FIGS. 10A and 10B, the driving sub-circuit 31 includes a plurality of shift registers RS that are cascaded (e.g., a first-stage shift register RS(1), a second-stage shift register RS(2), a third-stage shift register RS(3), . . . in FIG. 10B). An output terminal Oput of a shift register in each stage is a driving signal output terminal OUT. It will be understood that, the output terminal Oput of the shift register RS in each stage is configured to output the driving signal.

An input terminal of the first-stage shift register is coupled to an input signal line. The output terminal of the shift register in each stage except a last-stage shift register is coupled to an input terminal of a shift register in a next stage. For example, referring to FIG. 10B, the input terminal IN of the first-stage shift register RS(1) is coupled to the input signal line STV; an output terminal Oput of the first-stage shift register RS(1) is coupled to an input terminal IN of the second-stage shift register RS(2), an output terminal Oput of the second-stage shift register RS(2) is coupled to an input terminal IN of the third-stage shift register RS(3), and so forth, until an input terminal of the last-stage shift register is coupled to an output terminal of a shift register in a previous stage.

It will be understood that, the number of the shift registers is the same as the number of rows of sub-pixels in the display units. Each shift register in each driving sub-circuit outputs a driving signal to a row of sub-pixels in the display units coupled to the driving sub-circuit. For example, referring to FIG. 10A, in a case where the sub-pixels P in the display unit 20 are three rows of sub-pixels, the driving sub-circuit 31 includes three shift registers RS(1), RS(2) and RS(3) cascaded in sequence.

It will be noted that, FIGS. 6, 7, 8, 9 and 10A are schematic diagrams showing only connections between the pixel islands and the circuits. However, actual circuit connections are not limited thereto, and may be designed according to actual situations, which is not limited herein.

For example, first clock signal terminals of two adjacent cascaded shift registers are coupled to different clock signal lines, and second clock signal terminals thereof are coupled to different clock signal lines. For example, referring to FIG. 10B, first clock signal terminals CLK1 of shift registers in odd-numbered stages are coupled to a first clock signal line CLKA, and second clock signal terminals CLK2 of the shift registers in the odd-numbered stages are coupled to a second clock signal line CLKB; and first clock signal terminals CLK1 of shift registers in even-numbered stages are coupled to the second clock signal line CLKB, and second clock signal terminals CLK2 of the shift registers in the even-numbered stages are coupled to the first clock signal line CLKA. There is a certain phase difference between a signal transmitted by the first clock signal line CLKA and a signal transmitted by the second clock signal line CLKB. For example, the signal transmitted by the first clock signal line CLKA and the signal transmitted by the second clock signal line CLKB are inverted signals.

Figure 11:
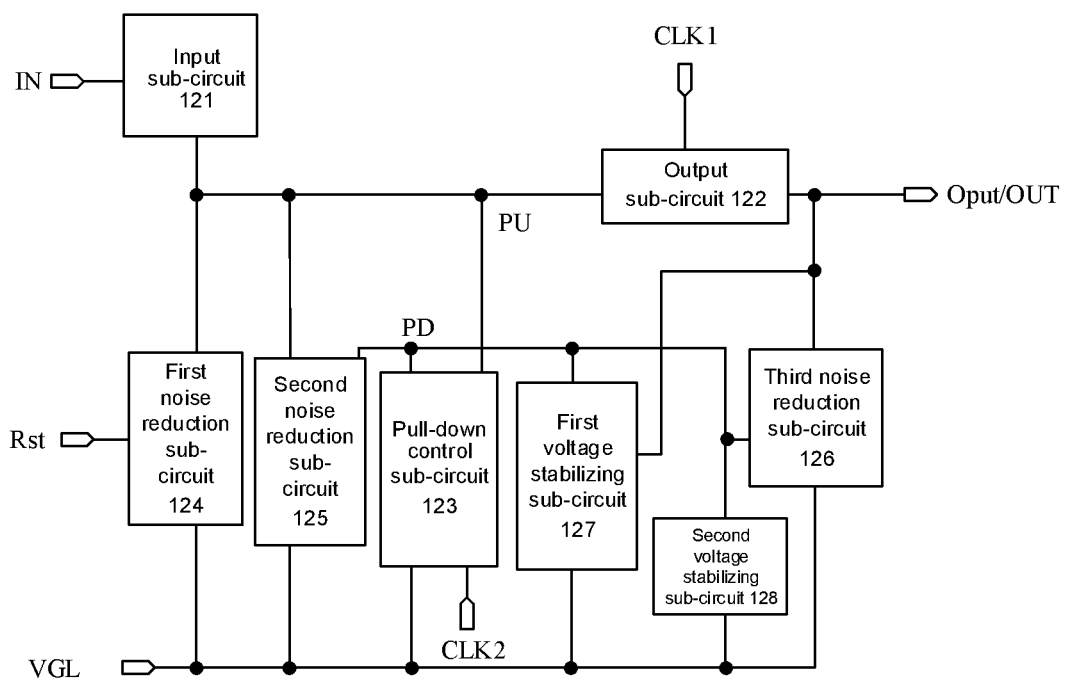
FIG. 11 is a structural diagram of a shift register, in accordance with some embodiments.

For example, as shown in FIG. 11, the shift register RS includes an input sub-circuit 121 and an output sub-circuit 122. The input sub-circuit 121 is coupled to an input signal terminal IN and a pull-up node PU. The output sub-circuit 122 is coupled to the pull-up node PU, the first clock signal terminal CLK1 and an output terminal Oput. The input sub-circuit 121 is configured to transmit an input signal received at the input signal terminal IN to the pull-up node PU in response to the input signal. The output sub-circuit 122 is configured to transmit a first clock signal received at the first clock signal terminal CLK1 to the output terminal Oput in response to a voltage of the pull-up node PU. It will be understood that a signal output from the output terminal Oput is the driving signal.

Figure 12:
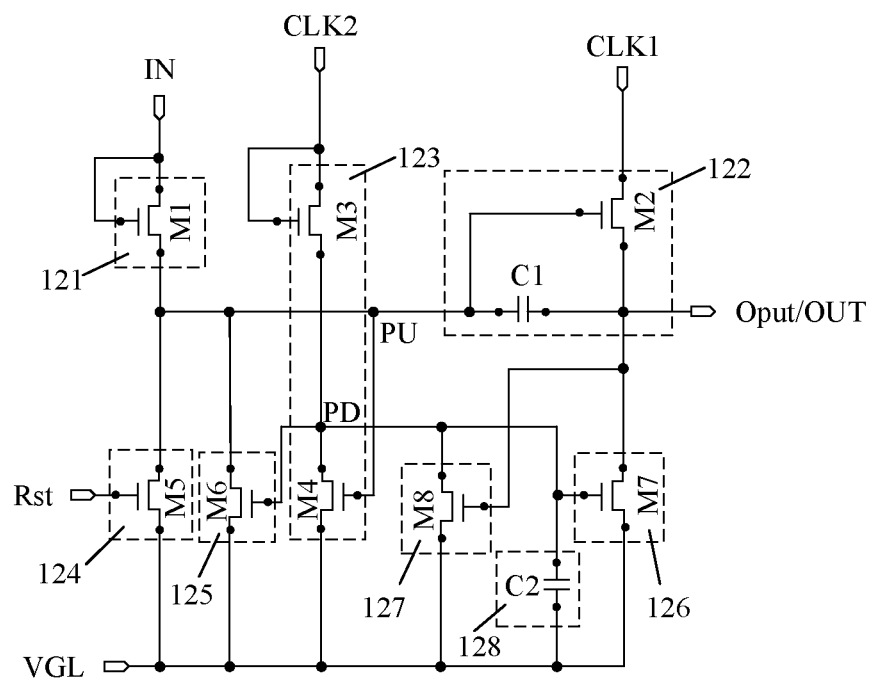
FIG. 12 is a structural diagram of another shift register, in accordance with some embodiments.

For example, as shown in FIG. 12, the input sub-circuit 121 includes a first transistor M1. A control electrode and a first electrode of the first transistor M1 are coupled to the input signal terminal IN, and a second electrode of the first transistor M1 is coupled to the pull-up node PU. For example, as shown in FIG. 12, the output sub-circuit 122 includes a second transistor M2 and a first capacitor C1. A control electrode of the second transistor M2 is coupled to the pull-up node PU, a first electrode of the second transistor M2 is coupled to the first clock signal terminal CLK1, and a second electrode of the second transistor M2 is coupled to the output terminal Oput. A first electrode of the first capacitor C1 is coupled to the pull-up node PU, and a second electrode of the first capacitor C1 is coupled to the output terminal Oput.

For example, as shown in FIG. 11, the shift register RS further includes a pull-down control sub-circuit 123. The pull-down control sub-circuit 123 is coupled to the second clock signal terminal CLK2, the pull-up node PU, a pull-down node PD, and a voltage terminal VGL. The pull-down control sub-circuit 123 is configured to: transmit a second clock signal received at the second clock signal terminal CLK2 to the pull-down node PD in response to the second clock signal; and transmit a voltage of the voltage terminal VGL to the pull-down node PD in response to the voltage of the pull-up node PU. For example, the voltage terminal VGL is configured to transmit a direct current (DC) low-level signal.

For example, as shown in FIG. 12, the pull-down control sub-circuit 123 includes a third transistor M3 and a fourth transistor M4. A control electrode and a first electrode of the third transistor M3 are coupled to the second clock signal terminal CLK2, and a second electrode of the third transistor M3 is coupled to the pull-down node PD. A control electrode of the fourth transistor M4 is coupled to the pull-up node PU, a first electrode of the fourth transistor M4 is coupled to the voltage terminal VGL, and a second electrode of the fourth transistor M4 is coupled to the pull-down node PD.

For example, as shown in FIG. 11, the shift register RS further includes a first noise reduction sub-circuit 124. The first noise reduction sub-circuit 124 is coupled to the voltage terminal VGL, a reset signal terminal Rst, and the pull-up node PU. The first noise reduction sub-circuit 124 is configured to transmit the voltage of the voltage terminal VGL to the pull-up node PU in response to a reset signal received at the reset signal terminal Rst. In this way, it is possible to reduce noise of the pull-up node during an ineffective output period of the shift register to avoid signal interference.

For example, as shown in FIG. 12, the first noise reduction sub-circuit 124 includes a fifth transistor M5. A control electrode of the fifth transistor M5 is coupled to the reset signal terminal Rst, a first electrode of the fifth transistor M5 is coupled to the voltage terminal VGL, and a second electrode of the fifth transistor M5 is coupled to the pull-up node PU.

For example, as shown in FIG. 11, the shift register RS further includes a second noise reduction sub-circuit 125. The second noise reduction sub-circuit 125 is coupled to the pull-down node PD, the voltage terminal VGL and the pull-up node PU. The second noise reduction sub-circuit 125 is configured to transmit the voltage of the voltage terminal VGL to the pull-up node PU in response to a voltage of the pull-down node PD. In this way, it is possible to reduce the noise of the pull-up node during the ineffective output period of the shift register to avoid the signal interference.

For example, as shown in FIG. 12, the second noise reduction sub-circuit 125 includes a sixth transistor M6. A control electrode of the sixth transistor M6 is coupled to the pull-down node PD, a first electrode of the sixth transistor M6 is coupled to the voltage terminal VGL, and a second electrode of the sixth transistor M6 is coupled to the pull-up node PU.

For example, as shown in FIG. 11, the shift register RS further includes a third noise reduction sub-circuit 126. The third noise reduction sub-circuit 126 is coupled to the pull-down node PD, the voltage terminal VGL and the output terminal Oput. The third noise reduction sub-circuit 126 is configured to transmit the voltage of the voltage terminal VGL to the output terminal Oput in response to the voltage of the pull-down node PD. In this way, it is possible to reduce noise of the output terminal during the ineffective output period of the shift register to avoid signal interference.

For example, as shown in FIG. 12, the third noise reduction sub-circuit 126 includes a seventh transistor M7. A control electrode of the seventh transistor M7 is coupled to the pull-down node PD, a first electrode of the seventh transistor M7 is coupled to the voltage terminal VGL, and a second electrode of the seventh transistor M7 is coupled to the output terminal Oput.

For example, as shown in FIG. 11, the shift register RS further includes a first voltage stabilizing sub-circuit 127. The first voltage stabilizing sub-circuit 127 is coupled to the pull-down node PD, the voltage terminal VGL and the output terminal Oput. The first voltage stabilizing sub-circuit 127 is configured to transmit the voltage of the voltage terminal VGL to the pull-down node PD in response to a signal received at the output terminal Oput, so as to control the voltage of the pull-down node PD. For example, in a case where the signal output from the output terminal Oput is a valid signal (e.g., a high-level signal), the first voltage stabilizing sub-circuit 127 transmits the voltage of the voltage terminal VGL to the pull-down node PD to control the voltage of the pull-down node PD to remain stable (e.g., the voltage of the pull-down node PD being maintained to be a low-level voltage), so that the output terminal Oput may stably perform an output.

For example, as shown in FIG. 12, the first voltage stabilizing sub-circuit 127 includes an eighth transistor M8. A control electrode of the eighth transistor M8 is coupled to the output terminal Oput, a first electrode of the eighth transistor M8 is coupled to the voltage terminal VGL, and a second electrode of the eighth transistor M8 is coupled to the pull-down node PD.

For example, as shown in FIG. 11, the shift register RS further includes a second voltage stabilizing sub-circuit 128. The second voltage stabilizing sub-circuit 128 is coupled to the voltage terminal VGL and the pull-down node PD. The second voltage stabilizing sub-circuit 128 is configured to control the voltage of the pull-down node PD according to the voltage of the voltage terminal VGL and the voltage of the pull-down node PD. For example, in a case where no signal is transmitted to the pull-down node PD, the voltage of the pull-down node PD is unstable. The second voltage stabilizing sub-circuit 128 may control the voltage of the pull-down node PD, for example, control the voltage of the pull-down node PD to be a high-level voltage, so that the voltage of the pull-down node PD remains stable, and it is ensured that the shift register operates normally.

For example, as shown in FIG. 12, the second voltage stabilizing sub-circuit 128 includes a second capacitor C2. A first electrode of the second capacitor C2 is coupled to the voltage terminal VGL, and a second electrode of the second capacitor C2 is coupled to the pull-down node PD.

Figure 13:
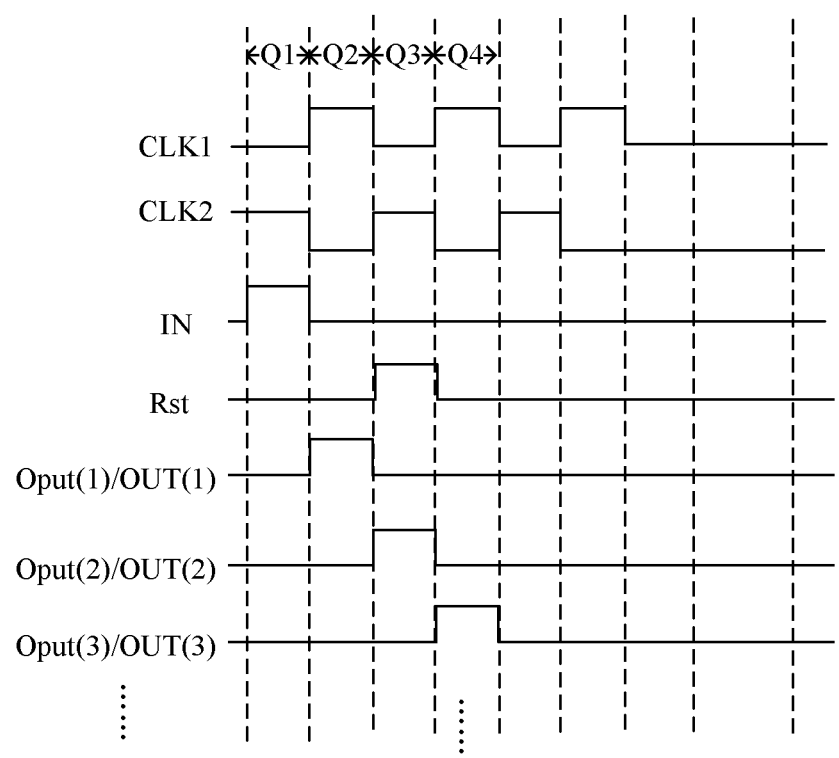
FIG. 13 is a diagram showing a driving timing of a shift register, in accordance with some embodiments.

For example, the transistors in the shift register are all N-type transistors. For example, in a first period (referring to Q1 in FIG. 13) during operation of the shift register RS, in response to the input signal received at the input signal terminal IN, the input sub-circuit 121 transmits the input signal to the pull-up node PU to charge the pull-up node PU. Under control of the voltage of the pull-up node PU, the output sub-circuit 122 transmits the first clock signal received at the first clock signal terminal CLK1 to the output terminal OUT. For example, in response to a high-level input signal, the first transistor M1 in the input sub-circuit 121 is turned on to transmit the input signal to the pull-up node PU, so that the voltage of the pull-up node PU is a high-level voltage to charge the first capacitor C1 in the output sub-circuit 122. The second transistor M2 in the output sub-circuit 122 transmits a low-level first clock signal to the output terminal Oput in response to the high-level voltage of the pull-up node PU. In this case, the driving signal output from the output terminal Oput is a low-level signal.

The pull-down control sub-circuit 123 transmits the second clock signal received at the second clock signal terminal CLK2 to the pull-down node PD in response to the second clock signal, and transmits the voltage of the voltage terminal VGL to the pull-down node PD in response to the voltage of the pull-up node PU. For example, under control of a high-level second clock signal, the third transistor M3 in the pull-down control sub-circuit 123 is turned on to transmit the second clock signal to the pull-down node PD. In response to the high-level voltage of the pull-up node PU, the fourth transistor M4 is turned on to transmit a low-level voltage of the voltage terminal VGL to the pull-down node PD. Since a width-to-length ratio of a channel of the fourth transistor M4 is greater than a width-to-length ratio of a channel of the third transistor M3, the voltage of the pull-down node PD is a low-level voltage.

In addition, none of the first noise reduction sub-circuit 124, the second noise reduction sub-circuit 125, and the third noise reduction sub-circuit 126 operates. That is, the fifth transistor M5, the sixth transistor M6, and the seventh transistor M7 are all turned off. The first voltage stabilizing sub-circuit 127 does not operate either. That is, the eighth transistor M8 is turned off.

For example, in a second period (referring to Q2 in FIG. 13) during the operation of the shift register RS, the output sub-circuit 122 transmits the first clock signal received at the first clock signal terminal CLK1 to the output terminal Oput under the control of the voltage of the pull-up node PU. For example, the first transistor M1 in the input sub-circuit 121 is turned off under control of a low-level input signal. Due to boost action of the first capacitor C1, the voltage of the pull-up node PU is still a high-level voltage. The second transistor M2 in the output sub-circuit 122 transmits a high-level first clock signal to the output terminal OUT in response to the high-level voltage of the pull-up node PU. In this case, the driving signal output from the output terminal Oput is a high-level signal.

The pull-down control sub-circuit 123 transmits the voltage of the voltage terminal VGL to the pull-down node PD in response to the voltage of the pull-up node PU. For example, the third transistor M3 in the pull-down control sub-circuit 123 is turned off under control of a low-level second clock signal. In response to the high-level voltage of the pull-up node PU, the fourth transistor M4 is turned on to transmit the low-level voltage of the voltage terminal VGL to the pull-down node PD, so that the pull-down node PD is at a low-level potential, and the voltage of the pull-down node PD is a low-level voltage.

The first voltage stabilizing sub-circuit 127 transmits the voltage of the voltage terminal VGL to the pull-down node PD in response to the signal received from the output terminal Oput. For example, the eighth transistor M8 in the first voltage stabilizing sub-circuit 127 transmits the low-level voltage of the voltage terminal VGL to the pull-down node PD in response to the high-level signal received at the output terminal Oput. In this case, the voltage of the pull-down node PD is a low-level voltage.

In addition, none of the first noise reduction sub-circuit, the second noise reduction sub-circuit and the third noise reduction sub-circuit operates.

For example, in a third period (referring to Q3 in FIG. 13) during the operation of the shift register RS, the first noise reduction sub-circuit 124 transmits the voltage of the voltage terminal VGL to the pull-up node PU in response to the reset signal received at the reset signal terminal Rst. For example, the fifth transistor M5 in the first noise reduction sub-circuit 124 transmits the low-level voltage of the voltage terminal VGL to the pull-up node PU in response to a high-level reset signal.

The pull-down control sub-circuit 123 transmits the second clock signal received at the second clock signal terminal CLK2 to the pull-down node PD in response to the second clock signal. For example, under control of a high-level second clock signal, the third transistor M3 in the pull-down control sub-circuit 123 is turned on to transmit the high-level second clock signal to the pull-down node PD, so that the voltage of the pull-down node PD is a high-level voltage. The fourth transistor M4 is turned off under control of a low-level voltage of the pull-up node PU. In this case, the voltage of the pull-down node PD is a high-level voltage.

The second noise reduction sub-circuit 125 transmits the voltage of the voltage terminal VGL to the pull-up node PU in response to the voltage of the pull-down node PD. For example, the sixth transistor M6 in the second noise reduction sub-circuit 125 transmits the low-level voltage of the voltage terminal VGL to the pull-up node PU in response to the high-level voltage of the pull-down node PD. In this case, the voltage of the pull-up node PU is a low-level voltage. In this case, the second transistor M2 in the output sub-circuit 122 is turned off under control of the low-level voltage of the pull-up node PU, and does not output the first clock signal. In this case, the third noise reduction sub-circuit 126 transmits the voltage of the voltage terminal VGL to the output terminal Oput in response to the voltage of the pull-down node PD. For example, the seventh transistor M7 in the third noise reduction sub-circuit 126 transmits the low-level voltage of the voltage terminal VGL to the output terminal Oput in response to the high-level voltage of the pull-down node PD, so that the output terminal Oput outputs a low-level signal. That is, the driving signal is a low-level signal.

For example, in a fourth period (referring to Q4 in FIG. 13) during the operation of the shift register RS, the third transistor M3 in the pull-down control sub-circuit 123 is turned off under control of a low-level second clock signal; the voltage of the pull-up node PU is the low-level voltage in a previous period, and the fourth transistor M4 is turned off under control of the low-level voltage of the pull-up node PU. In this case, the third transistor M3 does not transmit the second clock signal to the pull-down node PD, and the fourth transistor M4 does not transmit the voltage of the voltage terminal VGL to the pull-down node PD. In this case, the voltage of the pull-down node PD is unstable. The second voltage stabilizing sub-circuit 128 controls the voltage of the pull-down node PD according to the voltage of the pull-down node PD and the voltage of the voltage terminal VGL. For example, due to a storage function of the second capacitor C2 in the second voltage stabilizing sub-circuit 128, the second voltage stabilizing sub-circuit 128 controls the voltage of the pull-down node PD to be a high-level voltage according to the low-level voltage of the voltage terminal VGL.

The fifth transistor M5 in the first noise reduction sub-circuit 124 is in a turn-off state under control of a low-level reset signal. The second noise reduction sub-circuit 125 transmits the voltage of the voltage terminal VGL to the pull-up node PU in response to the voltage of the pull-down node PD. For example, the sixth transistor M6 in the second noise reduction sub-circuit 125 transmits the low-level voltage of the voltage terminal VGL to the pull-up node PU in response to the high-level voltage of the pull-down node PD. In this case, the voltage of the pull-up node PU is a low-level voltage. In this case, the second transistor M2 in the output sub-circuit 122 is turned off under control of the low-level voltage of the pull-up node PU, and does not output the first clock signal. In this case, the third noise reduction sub-circuit 126 transmits the voltage of the voltage terminal VGL to the output terminal Oput in response to the voltage of the pull-down node PD. For example, the seventh transistor M7 in the third noise reduction sub-circuit 126 transmits the low-level voltage of the voltage terminal VGL to the output terminal Oput in response to the high-level voltage of the pull-down node PD, so that a low-level signal is output through the output terminal Oput. That is, the driving signal is the low-level signal.

In some embodiments, in the driving sub-circuit, the output terminal of the shift register in each stage except the first-stage shift register is coupled to a reset signal terminal of a shift register in a previous stage. Referring to FIG. 10B, in the driving sub-circuit 31, the output terminal Oput of the second-stage shift register RS(2) is coupled to a reset signal terminal Rst of a shift register in a previous stage, i.e., the first-stage shift register RS(1); an output terminal Oput of the third-stage shift register RS(3) is coupled to a reset signal terminal of a shift register in a previous stage, i.e., the second-stage shift register RS(2). It will be understood that, in a period when the shift register in each stage outputs a valid signal, the shift register in the previous stage is reset. For example, a reset signal terminal of the last-stage shift register in the driving sub-circuit may be coupled to a reset signal line in the display panel to reset the last-stage shift register.

Figure 14:
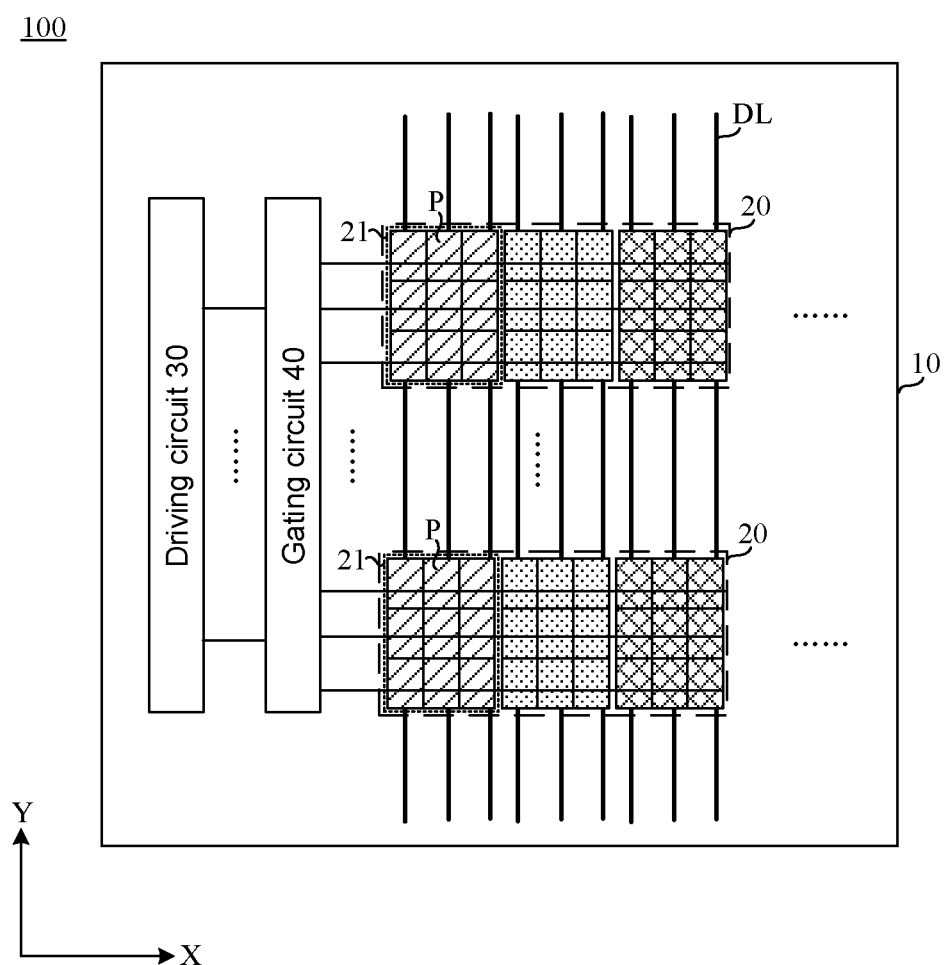
FIG. 14 is a structural diagram of yet another display panel, in accordance with some embodiments.

In some embodiments, as shown in FIG. 14, the display panel 100 includes a plurality of data lines DL disposed on the substrate 10. For example, a direction in which the plurality of data lines extend is parallel to a column direction in which the sub-pixels are arranged, and is parallel to a column direction in which the pixel islands 21 are arranged, and is parallel to a column direction in which the display units 21 are arranged. For example, referring to FIG. 14, the plurality of data lines DL extend in the Y direction. It will be understood that the data lines are each configured to transmit a data signal.

Figure 15:
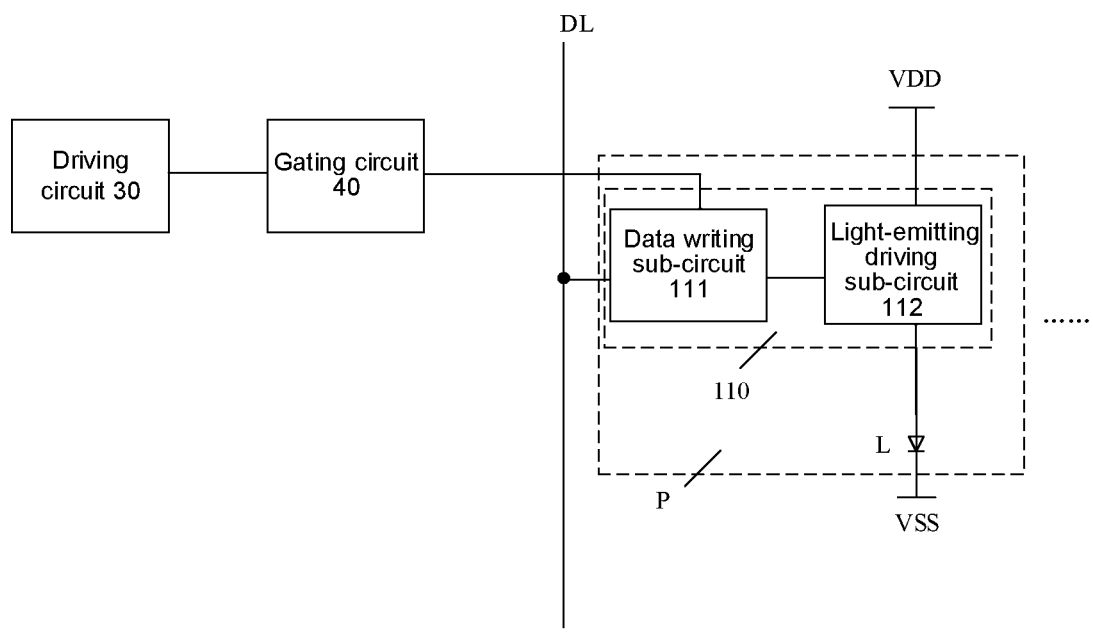
FIG. 15 is a structural diagram of yet another display panel, in accordance with some embodiments.

As shown in FIG. 15, the sub-pixel P includes the pixel circuit 110. The pixel circuit 110 includes a data writing sub-circuit 111. The data writing sub-circuit 111 is coupled to the gating circuit 40 and a data line DL. For example, in a case where the gating circuit 40 includes the gating sub-circuits 41, data writing sub-circuits 111 in pixel circuits 110 in sub-pixels in a display unit 20 are coupled to one gating sub-circuit 41. In a case where the gating sub-circuit 41 includes the switching sub-circuits 411, data writing sub-circuits 111 in pixel circuits 110 in sub-pixels in a row in a display unit 20 are coupled to one switching sub-circuit 411. In a case where the switching sub-circuit 411 includes the gating transistor MK, the second electrode of the gating transistor MK is coupled to the data writing sub-circuits 111. The gating circuit 40 is coupled to the driving circuit 30, and the gating circuit 40 may transmit the driving signal from the driving circuit 30. The data writing sub-circuit 111 is configured to write the data signal transmitted by the data line DL in response to the driving signal from the gating circuit 40. The gating circuit controls the data writing sub-circuit to form a conductive path with the driving circuit. For example, sub-pixels in a column in display units in a column are coupled to a same data line.

For example, as shown in FIG. 15, the pixel circuit further includes a light-emitting driving sub-circuit 112. The light-emitting driving sub-circuit 112 is coupled to the data writing sub-circuit 111 and a first power supply voltage terminal VDD, and is configured to output a driving current. The light-emitting driving sub-circuit 112 is further coupled to the light-emitting device L, and the light-emitting driving sub-circuit 112 may transmit the driving circuit to the light-emitting device L to drive the light-emitting device L to emit light. For example, referring to FIG. 16, the light-emitting driving sub-circuit 112 includes a driving transistor MD and a storage capacitor Cst.

Figure 16:
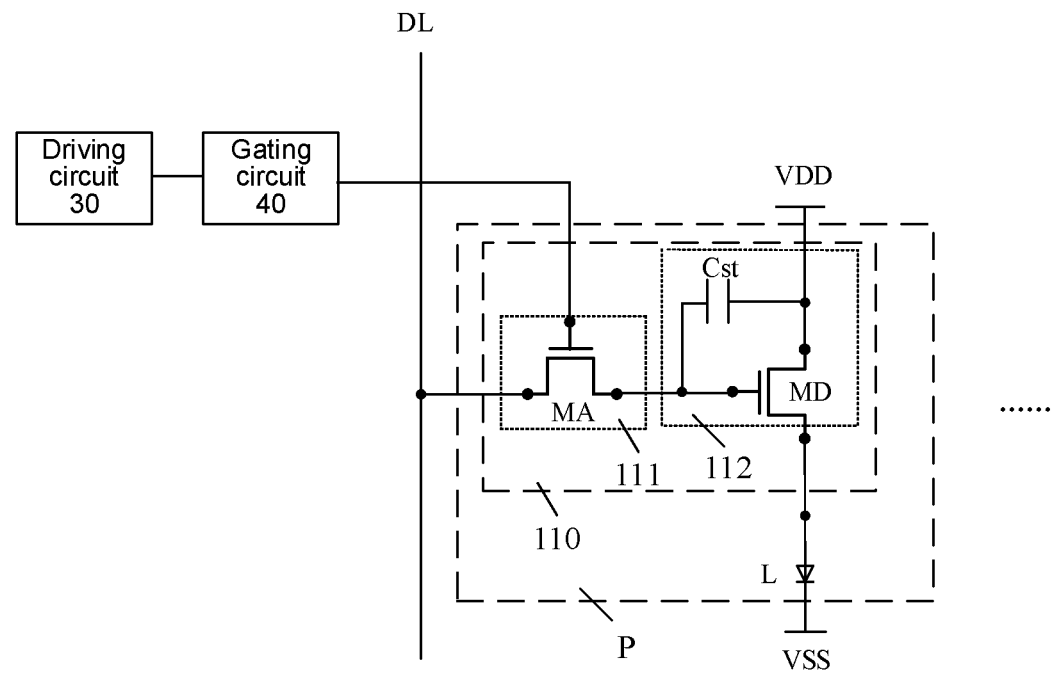
FIG. 16 is a structural diagram of yet another display panel, in accordance with some embodiments.
Figure 17:
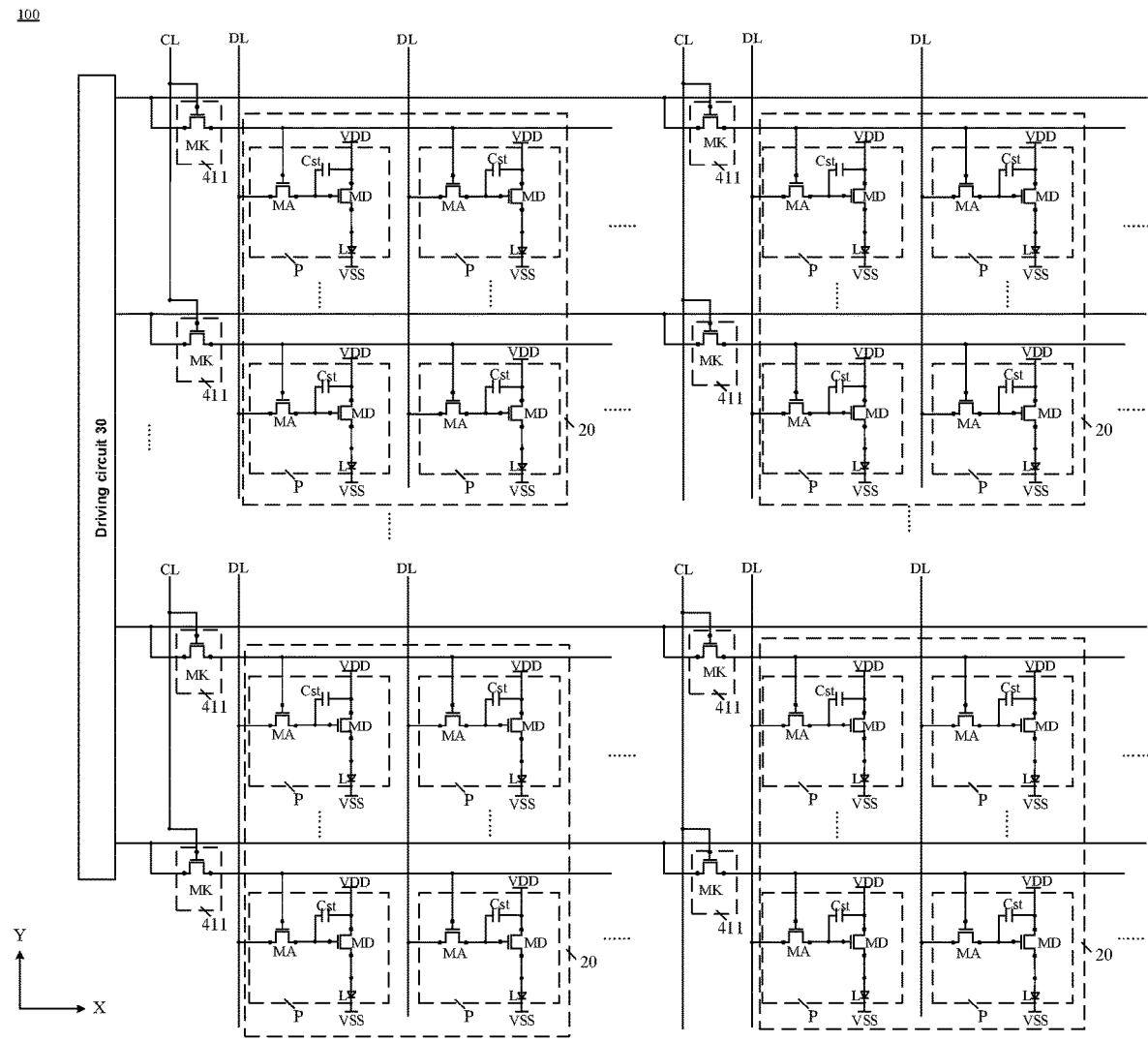
FIG. 17 is a structural diagram of yet another display panel, in accordance with some embodiments.

For example, referring to FIG. 16, the data writing sub-circuit 111 includes a data writing transistor MA. A control electrode of the data writing transistor MA is coupled to the gating circuit 40, a first electrode of the data writing transistor MA is coupled to the data line DL, and a second electrode of the data writing transistor MA is coupled to the light-emitting driving sub-circuit 112. For example, the second electrode of the data writing transistor MA is coupled to the driving transistor MD in the light-emitting driving sub-circuit 112. For example, the second electrode of the data writing transistor MA is coupled to a control electrode of the driving transistor MD. For example, referring to FIG. 17, in the case where the switching sub-circuit 411 includes the gating transistor MK, the control electrode of the data writing transistor MA is coupled to the second electrode of the gating transistor MK.

For example, referring to FIG. 16, the control electrode (a gate) of the data writing transistor MA is used to receive the driving signal (i.e., a gate driving signal), and the data writing transistor MA is turned on under control of the driving signal. In this case, the data signal is written into the control electrode of the driving transistor MD through the transistor MA. A first electrode of the driving transistor MD receives a first power supply voltage of the first power supply voltage terminal VDD. In a case where a difference between a voltage of the control electrode and a voltage of the first electrode of the driving transistor MD meets a turn-on condition of the driving transistor MD, the driving transistor MD generates a driving current, and transmits the driving current to the light-emitting device L to drive the light-emitting device L to emit light. For example, an electrode (e.g., an anode) of the light-emitting device L receives the driving current from the pixel circuit, and the other electrode (e. g., a cathode) of the light-emitting device L is coupled to a second power supply voltage terminal VSS. For example, the first power supply voltage of the first power supply voltage terminal and a second power supply voltage of the second power supply voltage terminal are both DC voltages. For example, the first power supply voltage is a DC high voltage, and the second power supply voltage is a DC low voltage.

It will be noted that, the transistors used in various circuits (e.g., including the driving circuit, the gating circuit and the pixel circuit) provided by the embodiments of the present disclosure may be thin film transistors (TFTs), field effect transistors (FETs), complementary metal oxide semiconductor (CMOS) transistors or other switching devices with same characteristics, which is not limited in the embodiments of the present disclosure. For example, in a case where the substrate of the display panel is a silicon-based substrate, the transistors may be CMOS transistors.

In some embodiments, the control electrode of each transistor described herein is a gate of the transistor, the first electrode of the transistor is one of a source and a drain of the transistor, and the second electrode of the transistor is the other one of the source and the drain of the transistor. Since the source and the drain of the transistor may be symmetrical in structure, there may be no difference in structure between the source and the drain of the transistor. That is to say, there is no difference in structure between the first electrode and the second electrode of the transistor in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided by the embodiments of the present disclosure, the various nodes described herein (e.g., including the pull-up node and the pull-down node) do not represent real components, but rather represent junctions of related electrical connections in a circuit diagram. That is to say, these nodes are equivalent nodes of the junctions of the related electrical connections in the circuit diagram.

Specific implementations of the circuits provided by the embodiments of the present disclosure, e.g., the various circuits described herein, which include the driving circuit, the driving sub-circuits in the driving circuit, the shift registers in the driving sub-circuit, the gating circuit, the gating sub-circuits in the gating circuit, the switching sub-circuits in the gating sub-circuit, the pixel circuit, the data writing sub-circuit and the light-emitting driving sub-circuit in the pixel circuit, are not limited to the implementations described above, and may be any implementations used, such as conventional connection manners well known to a person skilled in the art, as long as corresponding functions may be achieved. The above examples cannot limit the protection scope of the present disclosure. In practical applications, a person skilled in the art may choose to use or not to use one or more of the above circuits according to situations, and various combinations and modifications of the above circuits do not depart from the principle of the present disclosure, and details will not be repeated herein.

It will be noted that, for convenience of description, in the embodiments of the present disclosure, some signal terminals, signals transmitted by the signal terminals, and signal lines coupled to the signal terminals are represented by same reference signs, but they have different attributes.

Figure 18A:
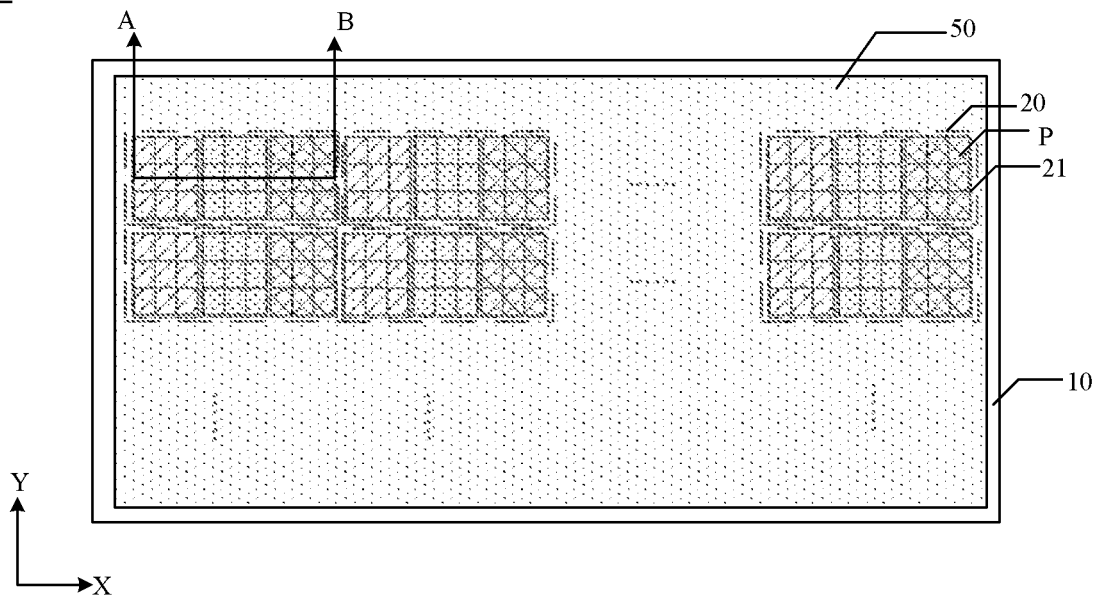
FIG. 18A is a structural diagram of yet another display panel, in accordance with some embodiments.
Figure 18B:
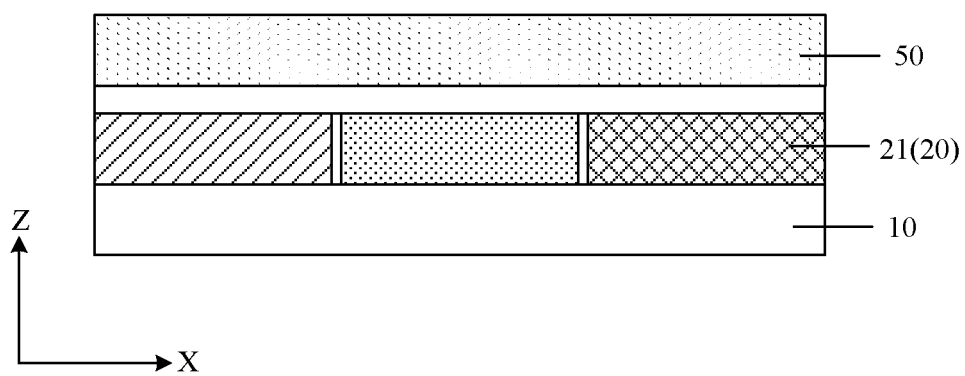
FIG. 18B is a cross-sectional view of the display panel taken along the A-B direction in FIG. 18A.
Figure 19:
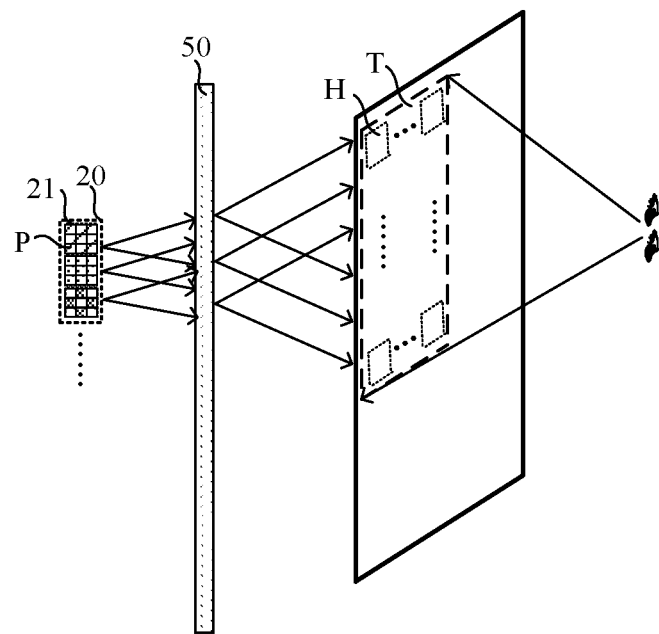
FIG. 19 is an optical schematic diagram of an optical film, in accordance with some embodiments.

In some embodiments, as shown in FIGS. 18A and 18B, the display panel 100 further includes an optical film 50. The optical film 50 is disposed on a side of the plurality of display units 20 away from the substrate 10. That is, in a direction perpendicular to a plane where the display panel 100 is located (e. g., a Z direction in FIG. 18B), the optical film 50 is farther away from the substrate 10 than the plurality of display units 20. The optical film 50 is configured to refract light emitted by the sub-pixels P in the pixel islands 21 in the display units 20 in the display panel 100, so as to disperse the light to a plurality of pixel regions H (referring to FIG. 19).

A pixel region refers to a region where a pixel is located. Light emitted by the pixel is composed of light emitted by sub-pixels of different colors from different pixel islands. For example, red light emitted by red sub-pixels in the display units is refracted by the optical film, and then is dispersed to multiple pixel regions; green light emitted by green sub-pixels in the display units is refracted by the optical film, and then is dispersed to multiple pixel regions; and blue light emitted by blue sub-pixels in the display units is refracted by the optical film, and then is dispersed to multiple pixel regions. For example, after being refracted by the optical film, light of different colors emitted by the sub-pixels of different colors is superimposed in the direction perpendicular to the plane where the display panel is located, and is converged to a same pixel region, so that gray scale display is achieved. In this case, a size of the pixel region is the same as a size of the sub-pixel, so that design space of circuits for driving the sub-pixels to emit light may be increased, and the PPI of the display panel may be improved. Alternatively, for example, after being refracted by the optical film, the light of different colors emitted by the sub-pixels of different colors is arranged at intervals in a direction parallel to the plane where the display panel is located, and is converged to a same pixel region, so that the gray scale display is achieved. In this case, the size of the pixel region is approximately n times the size of the sub-pixel, and n represents the number of sub-pixels converged to the same pixel region.

For example, the optical film includes a microlens film. The light emitted by the sub-pixels in the display units is refracted by the microlens film, and then is dispersed to the plurality of pixel regions. For example, the microlens film includes a plurality of microlenses arranged in sequence. For example, a microlens corresponds to a position of a sub-pixel. Alternatively, a microlens corresponds to a position of a pixel island. The microlens may refract light emitted by the sub-pixel corresponding thereto to multiple pixel regions.

It will be noted that, the optical film may be designed according to actual situations, so that the light refracted by the optical film is dispersed to a plurality of designated pixel regions. For example, referring to FIG. 19, the plurality of pixel regions H are included in a region T that is to display an image. For example, the region T that is to display the image may be a region where the user views the display apparatus (or the display panel).

Figure 20:
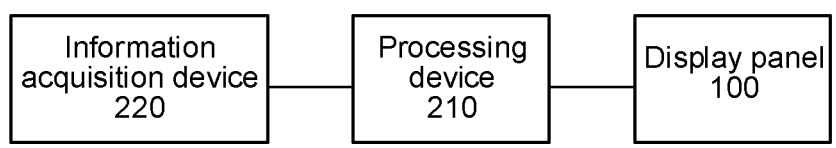
FIG. 20 is a structural diagram of another display apparatus, in accordance with some embodiments.

In the display apparatus provided by the embodiments of the present disclosure, as shown in FIG. 20, the display apparatus 200 further includes a processing device 210. For example, the processing device 210 is coupled to the display panel 100. For example, the processing device includes a timing controller (TCON).

The processing device is configured to: transmit at least one control signal to the gating circuit in the display panel according to information of the region that is to display the image of the display panel, so as to realize a connection of the driving circuit in the display panel to at least one display unit corresponding to the region that is to display the image in the display panel; and transmit at least one input signal to the driving circuit in the display panel according to the information of the region that is to display the image of the display panel, so that the driving circuit transmits at least one driving signal to the at least one display unit corresponding to the region that is to display the image of the display panel, and in turn, the region that is to display the image displays an image.

A region (e.g., multiple pixel regions) where at least one display unit performs displays is the same as or corresponds to the region that is to display the image, and then the at least one display unit is the at least one display unit corresponding to the region that is to display the image.

In this case, the processing device transmits at least one control signal to the gating circuit according to the information of the region that is to display the image of the display panel, and controls the at least one display unit corresponding to the region that is to display the image to be connected to the driving circuit through the control signal(s) received by the gating circuit (e. g., gating sub-circuit(s) in the gating circuit), so that the at least one display unit corresponding to the region that is to display the image may receive the driving signal(s) from the driving circuit. In addition, the processing device transmits at least one input signal to the driving circuit according to the information of the region that is to display the image of the display panel, so that the driving circuit (e.g., driving sub-circuits in the driving circuit) connected to the at least one display unit corresponding to the region that is to display the image receives the input signal(s), and outputs the at least one driving signal. In this way, the at least one display unit corresponding to the region that is to display the image may receive the driving signal(s), so that the at least one display unit receiving the driving signal(s) performs display, and in turn, the region that is to display the image displays the image. In this case, the partitioned driving and the partitioned display of the display panel are achieved, and power consumption of the display apparatus is saved.

In some embodiments, as shown in FIG. 20, the display apparatus 200 further includes an information acquisition device 220. For example, the information acquisition device 220 is coupled to the processing device 210. The information acquisition device is configured to acquire information of the sight line of the user. The processing device is further configured to obtain the information of the sight line of the user, and determine the information of the region that is to display the image of the display panel according to the information of the sight line of the user.

For example, the information acquisition device may be any device having a sight line acquisition function, such as a camera or an eyeball tracker.

It will be understood that, the information acquisition device acquires the information of the sight line of the user, and sends the information of the sight line of the user to the processing device. The processing device obtains the information of the sight line of the user, and determines the information of the region that is to display the image of the display panel according to the information of the sight line of the user. For example, the information of the region that is to display the image includes a position and a size of the region that is to display the image. For example, according to the information of the region that is to display the image, the at least one display unit corresponding to the region that is to display the image may be obtained.

Therefore, according to actual situations of the display apparatus viewed by the user, the information of the region that is to display the image may be obtained, the display unit(s) corresponding to the region that is to display the image may be determined, and the display unit(s) are driven so that the region that is to display the image displays the image. As a result, the active area of the display apparatus may be adjusted according to the actual situations viewed by the user, so that the display apparatus may be made in the partial display state or the full-screen display state, and in turn, the power consumption of the display apparatus may be reduced while use requirements of the user are satisfied.

For example, the display apparatus further includes a driver chip. For example, the driver chip is a driver integrated circuit (IC). For example, the driver IC includes a source driver. For example, the driver chip is configured to provide driving signals to the sub-pixels in the display panel. For example, the driving signals include data signals.

Some embodiments of the present disclosure provide a method for driving a display panel. The display panel is the display panel in any one of the above embodiments. The driving method includes the following steps.

At least one input signal is transmitted to the driving circuit in the display panel according to information of a region that is to display the image of the display panel, so that in response to the at least one input signal, the driving circuit transmits at least one driving signal to at least one display unit corresponding to the region that is to display the image.

For example, in a case where the driving circuit includes the driving sub-circuits, the driving sub-circuit receives an input signal and outputs a driving signal. For example, in a case where the driving sub-circuit includes the shift registers, the shift register outputs the driving signal. For example, input signal(s) are transmitted to driving sub-circuit(s) in the driving circuit that are coupled to the display unit(s) corresponding to the region that is to display the image, and no input signal(s) are transmitted to driving sub-circuit(s) coupled to remaining display unit(s). In this way, the power consumption is reduced.

At least one control signal is transmitted to the gating circuit in the display panel according to the information of the region that is to display the image of the display panel, so that the gating circuit realizes a connection of the driving circuit to the at least one display unit corresponding to the region that is to display the image in the plurality of display units according to the at least one control signal. In turn, the at least one display unit receives the at least one driving signal from the driving circuit, so that the at least one display unit corresponding to the region that is to display the image is driven to perform display.

For example, in the case where the gating circuit includes the gating sub-circuits, at least one gating sub-circuit receives the at least one control signal to make the driving circuit to be connected to the at least one display unit. For example, in the case where the gating sub-circuit includes the switching sub-circuits, the switching sub-circuits in the gating sub-circuit receive the control signal to make sub-pixels in each row in a display unit to be connected to the driving circuit. For example, control signal(s) are transmitted to gating sub-circuit(s) in the gating circuit coupled to the display unit(s) corresponding to the region that is to display the image, and no control signal(s) are transmitted to gating sub-circuit(s) coupled to remaining display unit(s). In this way, the power consumption is reduced.

In this case, in the display panel, the at least one display unit corresponding to the region that is to display the image performs display, and the remaining display unit(s) do not perform display, so that the region that is to display the image is in the display state, and a remaining area is in the non-display state. That is, a partial region of the display panel displays an image, and a remaining partial region does not display an image. As a result, partitioned control of the display units is achieved, and the power consumption of the display panel is reduced.

In some embodiments, the driving method further includes: obtaining the information of the sight line of the user; and determining the information of the region that is to display the image of the display panel according to the information of the sight line of the user. In this way, the display of the display panel may meet the actual situations viewed by the user, which may improve the user experience.

It will be noted that, beneficial effects of the method for driving the display panel described above are the same as beneficial effects of the display panel and the display apparatus described in some embodiments described above, and reference may be made to the description of corresponding parts, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having an active area, the display panel comprising:
   a substrate;
   a plurality of display units disposed on the substrate and located in the active area, each display unit including a plurality of pixel islands, and each pixel island including a plurality of sub-pixels of a same color;
   a driving circuit disposed on the substrate and located outside the active area, the driving circuit being configured to output a plurality of driving signals; and
   a gating circuit disposed on the substrate, the gating circuit being coupled to the driving circuit, the gating circuit being further coupled to sub-pixels of pixel islands in at least part of the plurality of display units, and the gating circuit being configured to control a connection of the driving circuit to sub-pixels of pixel islands of at least one display unit in the at least part of the plurality of display units, so that the sub-pixels of the pixel islands of the at least one display unit are driven by at least one driving signal from the driving circuit to perform display, wherein
   each sub-pixel in the sub-pixels of the pixel islands of the at least one display unit includes a light-emitting device; the light-emitting device includes a light-emitting layer; no gap exists between light-emitting layers of light-emitting devices in sub-pixels in a pixel island of the at least one display unit.

2. The display panel according to claim 1, further comprising:
   a plurality of control signal lines disposed on the substrate, wherein
   the driving circuit includes a plurality of driving signal output terminals for transmitting the plurality of driving signals;
   the gating circuit includes a plurality of gating sub-circuits, a gating sub-circuit in the plurality of gating sub-circuits is coupled to at least one control signal line, sub-pixels of pixel islands in a display unit and at least one driving signal output terminal; and
   the gating sub-circuit is configured to transmit at least one driving signal received at the at least one driving signal output terminal to the sub-pixels of pixel islands in the display unit in response to at least one control signal transmitted by the at least one control signal line.

3. The display panel according to claim 2, wherein the display unit includes at least one row of sub-pixels; and
   the gating sub-circuit includes:
   at least one switching sub-circuit, a switching sub-circuit being coupled to a control signal line, a driving signal output terminal and a row of sub-pixels in the display unit, and the switching sub-circuit being configured to transmit a driving signal received at the driving signal output terminal to the row of sub-pixels coupled to the switching sub-circuit in response to a control signal transmitted by the control signal line.

4. The display panel according to claim 3, wherein the plurality of display units are arranged in an array; and
   switching sub-circuits coupled to sub-pixels in a same row in display units in a row of display units are coupled to a same driving signal output terminal.

5. The display panel according to claim 3, wherein at least one switching sub-circuit in the gating sub-circuit is coupled to a same control signal line.

6. The display panel according to claim 3, wherein the switching sub-circuit includes:
   a gating transistor, a control electrode of the gating transistor being coupled to the control signal line, a first electrode of the gating transistor being coupled to the driving signal output terminal, and a second electrode of the gating transistor being coupled to the row of sub-pixels in the display unit.

7. The display panel according to claim 2, wherein different gating sub-circuits are coupled to different control signal lines.

8. The display panel according to claim 2, further comprising:
a plurality of input signal lines disposed on the substrate, wherein
the driving circuit includes:
a plurality of driving sub-circuits, wherein each driving sub-circuit is coupled to an input signal line, and the driving sub-circuit includes driving signal output terminals;
the driving sub-circuit is configured to output driving signals through the driving signal output terminals of the driving sub-circuit according to an input signal transmitted by the input signal line.

9. The display panel according to claim 8, wherein the driving sub-circuit includes a plurality of shift registers that are cascaded; an output terminal of a shift register in each stage is a driving signal output terminal;
an input terminal of a first-stage shift register is coupled to the input signal line;
the output terminal of the shift register in each stage except a last-stage shift register is coupled to an input terminal of a shift register in a next stage.

10. The display panel according to claim 1, further comprising:
a plurality of data lines disposed on the substrate, wherein
a sub-pixel in the sub-pixels of the pixel islands of the at least one display unit includes a pixel circuit; and
the pixel circuit includes a data writing sub-circuit; the data writing sub-circuit is coupled to the gating circuit and a data line; the data writing sub-circuit is configured to write a data signal transmitted by the data line in response to a driving signal from the gating circuit.

11. The display panel according to claim 1, further comprising:
an optical film disposed on a side of the plurality of display units away from the substrate, the optical film being configured to refract light emitted by the sub-pixels of the pixel islands of the at least one display unit in the display panel, so as to disperse the light to a plurality of pixel regions.

12. A display apparatus, comprising the display panel according to claim 1.

13. The display apparatus according to claim 12, further comprising:
a processing device configured to: transmit at least one control signal to the gating circuit in the display panel according to information of a region that is to display an image of the display panel, so as to realize a connection of the driving circuit in the display panel to at least one display unit corresponding to the region that is to display the image in the display panel; and transmit at least one input signal to the driving circuit in the display panel according to the information of the region that is to display the image of the display panel, so that the driving circuit transmits at least one driving signal to the at least one display unit corresponding to the region that is to display the image.

14. The display apparatus according to claim 13, further comprising:

an information acquisition device coupled to the processing device, the information acquisition device being configured to acquire information of a sight line of a user, wherein
the processing device is further configured to obtain the information of the sight line of the user, and determine the information of the region that is to display the image of the display panel according to the information of the sight line of the user.

15. The display panel according to claim 1, wherein the gating circuit is located in the active area and outside the plurality of display units.

16. A method for driving a display panel, the display panel having an active area, the display panel comprising: a substrate; a plurality of display units disposed on the substrate and located in the active area, each display unit including a plurality of pixel islands, and each pixel island including a plurality of sub-pixels of a same color; a driving circuit disposed on the substrate and located outside the active area, the driving circuit being configured to output a plurality of driving signals; and a gating circuit disposed on the substrate, the gating circuit being coupled to the driving circuit, the gating circuit being further coupled to sub-pixels of pixel islands in at least part of the plurality of display units, and the gating circuit being configured to control a connection of the driving circuit to sub-pixels of pixel islands of at least one display unit in the at least part of the plurality of display units, so that the sub-pixels of the pixel islands of the at least one display unit are driven by at least one driving signal from the driving circuit to perform display, and the method comprising:
transmitting at least one input signal to the driving circuit in the display panel according to information of a region that is to display an image of the display panel, so that the driving circuit transmits at least one driving signal to at least one display unit corresponding to the region that is to display the image in response to the at least one input signal; and
transmitting at least one control signal to the gating circuit in the display panel according to the information of the region that is to display the image of the display panel, so that the gating circuit realizes a connection of the driving circuit to the at least one display unit corresponding to the region that is to display the image in the plurality of display units according to the at least one control signal, and the at least one display unit receives the at least one driving signal from the driving circuit, so that the at least one display unit corresponding to the region that is to display the image is driven to perform display; wherein
each sub-pixel in the sub-pixels of the pixel islands of the at least one display unit includes a light-emitting device; the light-emitting device includes a light-emitting layer; no gap exists between light-emitting layers of light-emitting devices in sub-pixels in a pixel island of the at least one display unit.

17. The driving method according to claim 16, further comprising:
obtaining information of a sight line of a user; and
determining the information of the region that is to display the image of the display panel according to the information of the sight line of the user.

18. A display panel having an active area, the display panel comprising:
a substrate;
a plurality of display units disposed on the substrate and located in the active area, each display unit including a plurality of pixel islands, and each pixel island including a plurality of sub-pixels of a same color;

a driving circuit disposed on the substrate and located outside the active area, the driving circuit being configured to output a plurality of driving signals;

a gating circuit disposed on the substrate, the gating circuit being coupled to the driving circuit, the gating circuit being further coupled to sub-pixels of pixel islands in at least part of the plurality of display units, and the gating circuit being configured to control a connection of the driving circuit to sub-pixels of pixel islands of at least one display unit in the at least part of the plurality of display units, so that the sub-pixels of the pixel islands of the at least one display unit are driven by at least one driving signal from the driving circuit to perform display; and a plurality of control signal lines disposed on the substrate, wherein the driving circuit includes a plurality of driving signal output terminals for transmitting the plurality of driving signals;

the gating circuit includes a plurality of gating sub-circuits, a gating sub-circuit in the plurality of gating sub-circuits is coupled to at least one control signal line, sub-pixels of pixel islands in a display unit and at least one driving signal output terminal;

the gating sub-circuit is configured to transmit at least one driving signal received at the at least one driving signal output terminal to the sub-pixels of pixel islands in the display unit in response to at least one control signal transmitted by the at least one control signal line; and different gating sub-circuits are coupled to different control signal lines.

* * * * *